(12) United States Patent
Bothe et al.

(10) Patent No.: US 12,224,318 B2
(45) Date of Patent: Feb. 11, 2025

(54) RADIO FREQUENCY TRANSISTOR AMPLIFIERS HAVING SELF-ALIGNED DOUBLE IMPLANTED SOURCE/DRAIN REGIONS FOR IMPROVED ON-RESISTANCE PERFORMANCE AND RELATED METHODS

(71) Applicant: Wolfspeed, Inc., Durham, NC (US)

(72) Inventors: Kyle Bothe, Cary, NC (US); Chloe Hawes, Asheville, NC (US); Jennifer Gao, Burlington, NC (US); Scott Sheppard, Chapel Hill, NC (US)

(73) Assignee: Wolfspeed, Inc., Durham, NC (US)

( * ) Notice: Subject to any disclaimer, the term of this patent is extended or adjusted under 35 U.S.C. 154(b) by 469 days.

(21) Appl. No.: 17/669,479

(22) Filed: Feb. 11, 2022

(65) Prior Publication Data
US 2023/0261054 A1    Aug. 17, 2023

(51) Int. Cl.
*H01L 29/08*    (2006.01)
*H01L 21/265*    (2006.01)
(Continued)

(52) U.S. Cl.
CPC .... *H01L 29/0891* (2013.01); *H01L 21/26513* (2013.01); *H01L 21/266* (2013.01); *H01L 29/66462* (2013.01); *H01L 29/7786* (2013.01)

(58) Field of Classification Search
CPC ........... H01L 29/0891; H01L 29/42316; H01L 29/0843; H01L 29/2003; H01L 29/404; H01L 29/7786; H01L 29/66462; H01L 29/41758; H01L 21/266; H01L 21/266513; H01L 23/3677; H01L 23/481; H03F 2200/222; H03F 2200/387;
(Continued)

(56) References Cited

U.S. PATENT DOCUMENTS

2004/0211980 A1* 10/2004 Ryu .................... H01L 29/7828
257/E29.104
2010/0117155 A1* 5/2010 Kitakado .......... H01L 29/78621
257/E27.06
(Continued)

OTHER PUBLICATIONS

A Kink-Effect-Free Poly-Si Thin-Film Transistor With Current and Electric Field Split Structure Design (IEEE Transactions on Electron Devices, vol. 57, No. 10, Oct. 2010) (Year: 2010).*

*Primary Examiner* — Zandra V Smith
*Assistant Examiner* — Douglas Yap
(74) *Attorney, Agent, or Firm* — Myers Bigel, P.A.

(57) ABSTRACT

A HEMT transistor has a semiconductor layer structure that comprises a Group III nitride-based channel layer and a higher bandgap Group III nitride-based barrier layer on the channel layer. A gate finger and first and second source/drain contacts are provided on the semiconductor layer structure. A first source/drain region is provided in the semiconductor layer structure that includes a first implanted region that is underneath the first source/drain contact and a first auxiliary implanted region. A depth of the first implanted region is at least twice a depth of the first auxiliary implanted a region. The first source/drain region extends inwardly a first distance from a lower edge of an inner sidewall of the first source/drain contact, and extends outwardly a second smaller distance from a lower edge of an outer sidewall of the first source/drain contact.

27 Claims, 11 Drawing Sheets

(51) Int. Cl.
*H01L 21/266* (2006.01)
*H01L 29/66* (2006.01)
*H01L 29/778* (2006.01)

(58) Field of Classification Search
CPC .... H03F 2200/451; H03F 1/0288; H03F 1/56; H03F 3/245; H03F 3/195; H03F 3/211
See application file for complete search history.

(56) References Cited

U.S. PATENT DOCUMENTS

| | | | |
|---|---|---|---|
| 2010/0200931 A1* | 8/2010 | Matocha | H01L 29/1095 |
| | | | 257/E21.409 |
| 2019/0027611 A1* | 1/2019 | Kang | H01L 27/127 |
| 2020/0135908 A1* | 4/2020 | Nanjo | H01L 29/812 |
| 2020/0328275 A1* | 10/2020 | Lin | H01L 29/402 |
| 2022/0223700 A1 | 7/2022 | Bothe et al. | |

* cited by examiner

RADIO FREQUENCY TRANSISTOR AMPLIFIERS HAVING SELF-ALIGNED DOUBLE IMPLANTED SOURCE/DRAIN REGIONS FOR IMPROVED ON-RESISTANCE PERFORMANCE AND RELATED METHODS

FIELD

The present invention relates to microelectronic devices and, more particularly, to Group III nitride-based radio frequency ("RF") transistor amplifiers.

BACKGROUND

Electrical circuits requiring high power handling capability while operating at high frequencies, such as traditional cellular communication frequency bands (0.5-2.7 GHZ), S-band (3 GHZ), X-band (10 GHz), Ku-band (12-18 GHz), K-band (18-27 GHz), Ka-band (27-40 GHz) and V-band (40-75 GHZ) have become more prevalent. In particular, there is now high demand for RF transistor amplifiers that are used to amplify RF signals at frequencies of, for example, 500 MHz and higher (including microwave frequencies). These RF transistor amplifiers often need to exhibit high reliability, good linearity and handle high output power levels.

RF transistor amplifiers may be implemented in silicon or wide bandgap semiconductor materials, such as silicon carbide ("SiC") and Group III nitride materials. Herein, the term "wide bandgap" refers to semiconductor materials having a bandgap of greater than 1.40 eV. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements Silicon-based RF transistor amplifiers are typically implemented using laterally diffused metal oxide semiconductor ("LDMOS") transistors. Silicon LDMOS RF transistor amplifiers can exhibit high levels of linearity and may be relatively inexpensive to fabricate. Group III nitride-based RF transistor amplifiers are typically implemented as High Electron Mobility Transistors ("HEMT") and are primarily used in applications requiring high power and/or high frequency operation where LDMOS RF transistor amplifiers may have inherent performance limitations.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are arranged electrically in parallel. An RF transistor amplifier may be implemented as a single integrated circuit chip or "die," or may include a plurality of dies, where each die may include one or more amplification stages and/or matching circuits. When multiple RF transistor amplifier die are used, they may be connected in series and/or in parallel.

One important performance parameter for a Group III nitride-based RF transistor amplifier is the drain-to-source resistance during on-state operation ($R_{ds\text{-}on}$), which is also commonly referred to as the "on-resistance." The on-resistance may impact various performance parameters of the RF transistor amplifier, including its power added efficiency.

FIG. 1 is a schematic cross-sectional view of a unit cell transistor 2 of a conventional Group III nitride-based RF transistor amplifier. As shown in FIG. 1, the unit cell 2 includes a gate contact 22, a drain contact 24 and a source contact 26 that are each formed on an upper surface of a semiconductor layer structure 50, with the gate contact 22 being positioned between the drain contact 24 and the source contact 26. A first interlayer insulation layer 30 is formed on an upper surface of the semiconductor layer structure 50. A second interlayer insulation layer 32 is formed on the first interlayer insulation layer 30 that covers the gate contact 22. A field plate 28 is formed on an upper surface of the second interlayer insulation layer 32. The field plate 28 may be positioned above the semiconductor layer structure 50 in the region between the gate contact 22 and the drain contact 24, and may vertically overlap the gate contact 22 in an active region of the device. Herein, an element of an RF transistor amplifier "vertically overlaps" another element if an axis that is perpendicular to a plane defined by the top surface of the semiconductor layer structure of the RF transistor amplifier intersects both elements. The field plate 28 may be electrically connected to the source contact 26 by a field plate extension 29. A passivation layer 34 covers the field plate 28. The gate contact 22 penetrates the first interlayer insulation layer 30 to contact the upper surface of the semiconductor layer structure 50, and the drain contact 24 and the source contact 26 each penetrate the first interlayer insulation layer 30, second interlayer insulation layer 32 and the passivation layer 34 to contact the upper surface of the semiconductor layer structure 50.

The semiconductor layer structure 50 may include a substrate 52 and a plurality of epitaxial layers that are formed on the substrate 52. The epitaxial layers include at least a channel layer 54 and a barrier layer 56. A heavily doped drain region 64 is formed underneath the drain contact 24, and a heavily doped source region 66 is formed underneath the source contact 26. The heavily doped drain region 64 and the heavily doped source region 66 are each formed in the barrier layer 56, and may extend into the channel layer 54. When the gate, drain and source contacts 22, 24, 26 are connected to suitable direct current bias voltages and an RF signal is applied to the gate contact 22, a two-dimensional electron gas (2DEG) is induced in the channel layer 54 at a junction between the channel layer 54 and the barrier layer 56. The 2DEG acts as a highly conductive channel 62 that allows conduction between the source region 66 and the drain region 64.

SUMMARY

Pursuant to embodiments of the present invention, methods of forming high electron mobility transistors are provided. Pursuant to these methods, a semiconductor layer structure is formed that comprises a Group III nitride-based channel layer and a Group III nitride-based barrier layer that has a higher bandgap than the Group III nitride-based channel layer on an upper surface of the Group III nitride-based channel layer. A photoresist is formed in an upper surface of the semiconductor layer structure, and a first opening is formed in the photoresist. Ions are implanted into the semiconductor layer structure through the first opening to form a first implanted region in the semiconductor layer structure. The first opening in the photoresist is enlarged to create an expanded first opening, and then additional ions are implanted into the semiconductor layer structure through the expanded first opening using the photoresist as an ion implantation mask to form a first auxiliary implanted region in the semiconductor layer structure and to implant additional ions into the first implanted region.

In some embodiments, the first implanted region may extend further into the semiconductor layer structure than does the first auxiliary implanted region.

In some embodiments, the first auxiliary implanted region may merge into the first implanted region so that the first implanted region and the first auxiliary implanted region together form a first source/drain region in the semiconductor layer structure.

In some embodiments, the method may further comprise forming a second opening in the photoresist simultaneously with forming the first opening, implanting ions into the semiconductor layer structure through the second opening to form a second implanted region in the semiconductor layer structure simultaneously with forming the first implanted region, the second implanted region comprising at least a portion of a second source/drain region in the semiconductor layer structure, forming a gate finger on an upper surface of the semiconductor layer structure, the gate finger defining a first longitudinal axis that extends parallel to the upper surface of the semiconductor layer structure, forming a first source/drain contact on the first source/drain region, and forming a second source/drain contact on the second source/drain region. In such embodiments, the first source/drain contact, the second source/drain contact and the gate finger may be the contacts of a first unit cell transistor.

In some embodiments, the first source/drain contact may have an inner sidewall that faces the second source/drain contact and an outer sidewall opposite the inner sidewall, and the second source/drain contact may have an inner sidewall that faces the first source/drain contact and an outer sidewall opposite the inner sidewall, and a second longitudinal axis that bisects a top surface of the first source/drain region and that is parallel to the first longitudinal axis may be closer to the gate finger than is a third longitudinal axis that bisects a bottom surface of the first source/drain contact.

In some embodiments, the third longitudinal axis may vertically overlap a location where the first source/drain region has a maximum depth. In some embodiments, the third longitudinal axis may vertically overlap a location of a peak doping density of the first source/drain region. In some embodiments, the first auxiliary implanted region may be closer to the gate finger than is the first implanted region.

In some embodiments, a maximum doping density of the first implanted region may exceed a maximum doping density of the first auxiliary implanted region. In some embodiments, the first source/drain region is a drain region and the first source/drain contact is a drain contact.

In some embodiments, a field plate may extend above an upper surface of the gate finger, the field plate being electrically connected to the second source/drain contact and not vertically overlapping the first auxiliary implanted region.

In some embodiments, the high electron mobility transistor is part of a radio frequency transistor amplifier.

In some embodiments, the first source/drain region may extend a first distance from a lower edge of the inner sidewall of the first source/drain contact towards the second source/drain region along a transverse axis that extends parallel to a plane defined by the upper surface of the semiconductor layer structure and perpendicular to the first longitudinal axis, and may extend a second distance along the transverse axis from a lower edge of the outer sidewall of the first source/drain contact away from the second source/drain region, where the first distance exceeds the second distance. In some embodiments, the first distance may be between 10% and 50% larger than the second distance. In other embodiments, the first distance may be between 20% and 40% larger than the second distance. In some embodiments, the second source/drain region may extend a third distance along the transverse axis from a lower edge of the inner sidewall of the second source/drain contact towards the first source/drain region, where the first distance is between 10% and 50% larger than the third distance.

In some embodiments, the first source/drain region may have a first width along the transverse axis and the second source/drain region may have a second width along the transverse axis, where the first width exceeds the second width.

In some embodiments, an average sheet resistance of the first auxiliary implanted region may be between 25% and 200% greater than an average sheet resistance of the first implanted region. In some embodiments, an average sheet resistance of a 2DEG channel region of the transistor may be at least twice an average sheet resistance of the first auxiliary implanted region.

Pursuant to further embodiments of the present invention, high electron mobility transistors are provided that comprise a semiconductor layer structure that comprises a Group III nitride-based channel layer and a Group III nitride-based barrier layer that has a higher bandgap than the Group III nitride-based channel layer on an upper surface of the Group III nitride-based channel layer, a gate finger on an upper surface of the semiconductor layer structure, the gate finger having a first longitudinal axis that extends parallel to the upper surface of the semiconductor layer structure, a first source/drain contact on the upper surface of the semiconductor layer structure, the first source/drain contact having an inner sidewall that faces the gate finger and an outer sidewall opposite the inner sidewall, a second source/drain contact on the upper surface of the semiconductor layer structure, the second source/drain contact having an inner sidewall that faces the gate finger and an outer sidewall opposite the inner sidewall, a first source/drain region in an upper portion of the semiconductor layer structure, the first source/drain region including a first implanted region that is underneath the first source/drain contact and a first auxiliary implanted region that merges with the first implanted region, and a second source/drain region in an upper portion of the semiconductor layer structure underneath the second source/drain contact. A depth of the first implanted region is at least twice a depth of the first auxiliary implanted a region. The first source/drain region extends inwardly a first distance from a lower edge of the inner sidewall of the first source/drain contact towards the second source/drain region along a transverse axis that extends parallel to a plane defined by the upper surface of the semiconductor layer structure and perpendicular to the longitudinal axis, and extends outwardly a second distance along the transverse axis from a lower edge of the outer sidewall of the first source/drain contact away from the second source/drain region, where the first distance exceeds the second distance. The first source/drain contact, the second source/drain contact and the gate finger are contacts of a first unit cell transistor.

In some embodiments, the first distance is between 10% and 50% larger than the second distance. In other embodiments, the first distance is between 20% and 40% larger than the second distance.

In some embodiments, a lower surface of the first source/drain contact is vertically aligned with the first implanted region.

In some embodiments, the second source/drain region includes a second implanted region that is underneath the second source/drain contact and a second auxiliary implanted region that merges with the second implanted region.

In some embodiments, a second longitudinal axis that is parallel to the first longitudinal axis that bisects a top surface of the first source/drain region is closer to the gate finger than is a third longitudinal axis that bisects a bottom surface of the first source/drain contact.

In some embodiments, the third longitudinal axis vertically overlaps a location where the first source/drain region has a maximum depth.

In some embodiments, the third longitudinal axis vertically overlaps a location of a peak doping density of the first source/drain region.

In some embodiments, a maximum doping density of the first implanted region exceeds a maximum doping density of the first auxiliary implanted region.

In some embodiments, the first source/drain region is a drain region and the first source/drain contact is a drain contact.

In some embodiments, the second source/drain region extends a third distance along the transverse axis from a lower edge of the inner sidewall of the second source/drain contact towards the first source/drain contact, where the first distance is between 10% and 50% larger than the third distance.

In some embodiments, an average sheet resistance of the first auxiliary implanted region is between 25% and 200% greater than an average sheet resistance of the first implanted region.

In some embodiments, an average sheet resistance of a 2DEG channel region of the transistor is at least twice an average sheet resistance of the first auxiliary implanted region.

Pursuant to further embodiments of the present invention, methods of forming a high electron mobility transistor are provided in which a semiconductor layer structure is formed that comprises a Group III nitride-based channel layer and a Group III nitride-based barrier layer that has a higher bandgap than the Group III nitride-based channel layer on an upper surface of the Group III nitride-based channel layer. A photoresist is formed on an upper surface of the semiconductor layer structure. A first opening is formed in the photoresist. Ions are implanted into the semiconductor layer structure through the first opening to form a first auxiliary implanted region in the semiconductor layer structure and to form a preliminary first implanted region in the semiconductor layer structure. The photoresist is expanded to shrink a size of the first opening in the photoresist to create a narrowed first opening. Additional ions are implanted into the semiconductor layer structure through the narrowed first opening using the photoresist as an ion implantation mask to convert the preliminary first implanted region into a first implanted region in the semiconductor layer structure.

In some embodiments, the first implanted region extends further into the semiconductor layer structure than does the first auxiliary implanted region. In some embodiments, the first auxiliary implanted region merges into the first implanted region so that the first implanted region and the first auxiliary implanted region together form a first source/drain region in the semiconductor layer structure.

In some embodiments, the method further comprises forming a second opening in the photoresist simultaneously with forming the first opening, implanting ions into the semiconductor layer structure through the second opening to form a second auxiliary implanted region in the semiconductor layer structure simultaneously with forming the first auxiliary implanted region, the second auxiliary implanted region comprising a portion of a second source/drain region, forming a gate finger on an upper surface of the semiconductor layer structure, the gate finger defining a first longitudinal axis that extends parallel to the upper surface of the semiconductor layer structure, forming a first source/drain contact on the first source/drain region, and forming a second source/drain contact on the second source/drain region. The first source/drain contact, the second source/drain contact and the gate finger are the contacts of a first unit cell transistor.

In some embodiments, the first source/drain contact has an inner sidewall that faces the second source/drain contact and an outer sidewall opposite the inner sidewall, and the second source/drain contact has an inner sidewall that faces the first source/drain contact and an outer sidewall opposite the inner sidewall, and a second longitudinal axis that bisects a top surface of the first source/drain region and that is parallel to the first longitudinal axis is closer to the gate finger than is a third longitudinal axis that bisects a bottom surface of the first source/drain contact.

In some embodiments, the third longitudinal axis vertically overlaps a location where the first source/drain region has a maximum depth. In some embodiments, the third longitudinal axis vertically overlaps a location of a peak doping density of the first source/drain region.

In some embodiments, the first auxiliary implanted region is closer to the gate finger than is the first implanted region.

In some embodiments, a maximum doping density of the first implanted region exceeds a maximum doping density of the first auxiliary implanted region.

In some embodiments, the first source/drain region is a drain region and the first source/drain contact is a drain contact.

In some embodiments, the high electron mobility transistor is part of a radio frequency transistor amplifier.

In some embodiments, the first source/drain region extends a first distance from a lower edge of the inner sidewall of the first source/drain contact towards the second source/drain region along a transverse axis that extends parallel to a plane defined by the upper surface of the semiconductor layer structure and perpendicular to the first longitudinal axis, and extends a second distance along the transverse axis from a lower edge of the outer sidewall of the first source/drain contact away from the second source/drain region, where the first distance exceeds the second distance.

In some embodiments, the first distance is between 10% and 50% larger than the second distance. In some embodiments, the second source/drain region extends a third distance along the transverse axis from a lower edge of the inner sidewall of the second source/drain contact towards the first source/drain region, where the first distance is between 10% and 50% larger than the third distance. In some embodiments, the first source/drain region has a first width along the transverse axis and the second source/drain region has a second width along the transverse axis, where the first width exceeds the second width.

In some embodiments, an average sheet resistance of the first auxiliary implanted region is between 25% and 200% greater than an average sheet resistance of the first implanted region. In other embodiments, an average sheet resistance of a 2DEG channel region of the transistor is at least twice an average sheet resistance of the first auxiliary implanted region.

DETAILED DESCRIPTION

Referring again to FIG. 1, the drain contact 24 has an inner sidewall 25-1 that faces the gate contact 22 and an outer sidewall 25-2 that faces a gate contact of a first adjacent unit cell (not shown). Similarly, the source contact 26 has an inner sidewall 27-1 that faces the gate contact 22 and an outer sidewall 27-2 that faces a gate contact of a second adjacent unit cell (not shown). The source contact 26 may act as the source contact of both the illustrated unit cell and as the source contact of the first adjacent unit cell, and the drain contact 24 may act as the drain contact of both the illustrated unit cell and as the drain contact of the second adjacent unit cell.

Figure 1:
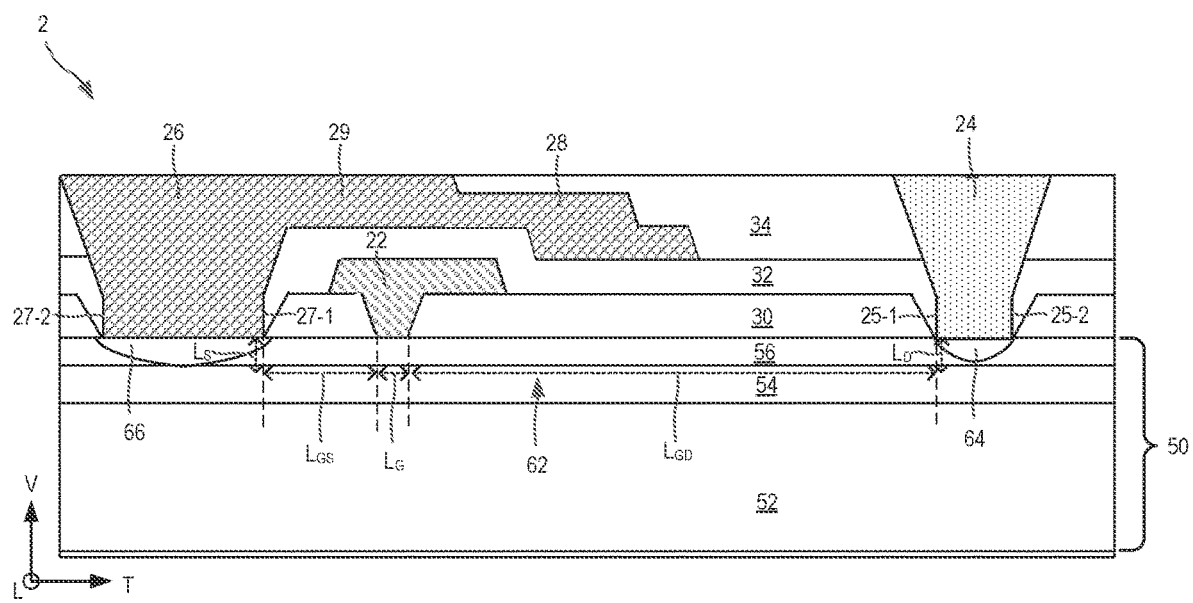
FIG. 1 is a schematic cross-sectional view of a unit cell of a conventional Group III nitride-based RF transistor amplifier.

As is further shown in FIG. 1, the conduction path between the source region 66 and the drain region 64 includes three primary regions (or segments when viewed in cross-section) and two additional regions/segments. The three primary regions/segments are each located along the 2DEG channel 62 that is formed at the junction between the channel layer 54 and the barrier layer 56. The first primary region/segment, which is labelled $L_{GS}$, refers to the portion of the channel that extends from underneath the lower edge of the inner sidewall 27-1 of the source contact 26 to underneath the lower edge of the sidewall of the gate contact 22 that faces the source contact 26. The second primary region/segment, which is labelled $L_G$, refers to the portion of the channel 62 that extends underneath the lower surface of the gate contact 22. The third primary region/segment, which is labelled $L_{GD}$, refers to the portion of the channel 62 that extends from underneath the lower edge of the sidewall of the gate contact 22 that faces the drain contact 24 to underneath the lower edge of the inner sidewall 25-1 of the drain contact 24. The first additional region/segment, which is labelled $L_S$, refers to the vertical distance from the bottom of the source contact 26 to the junction between the channel layer 54 and the barrier layer 56 (i.e., the vertical distance from the bottom of the source contact 26 to the 2DEG channel 62). The second additional region/segment, which is labelled $L_D$, refers to the vertical distance from the bottom of the drain contact 24 to the junction between the channel layer 54 and the barrier layer 56.

Each of the five above-described regions/segments has a distributed resistance that contributes to the on-resistance of the unit cell 2. In addition, lumped resistances exist at the interfaces between (1) the drain contact 24 and the drain region 64, (2) the source contact 26 and the source region 66, (3) the 2DEG channel 62 and the drain region 64, and (4) the 2DEG channel 62 and the source region 66. The portion of the barrier layer 56 between the source region 66 and the drain region 64 is either undoped or doped more lightly than the source and drain regions 66, 64. Thus, the primary segments $L_{GS}$ and $L_{GD}$ typically have a higher sheet resistance than the additional segments $L_S$, $L_D$, and the primary segments $L_{GS}$, $L_G$, $L_{GD}$ typically are significantly longer than the additional segments $L_S$, $L_D$. As such, the on-resistance may be primarily determined by the resistance of the three primary regions/segments $L_{GS}$, $L_G$, $L_{GD}$ and the above-described four lumped resistances The resistance of each region/segment $L_S$, $L_{GS}$, $L_G$, $L_{GD}$, $L_D$ may vary linearly with the length of the region/segment. In contrast, the lumped resistances tend to be fixed. The physical size of an RF transistor amplifier will vary based on its intended frequency of operation, with RF transistor amplifiers that operate at higher frequencies being smaller in size than RF transistor amplifiers that operate at lower frequencies. Because of this relationship, the three primary regions/segments $L_{GS}$, $L_G$, $L_{GD}$ may be significantly longer in RF transistor amplifiers that operate at lower frequencies (e.g., frequencies below about 6 GHZ) than in RF transistor amplifiers that operate at higher frequencies (e.g., frequencies above 18 GHZ). As such, for RF transistor amplifiers that operate at lower frequencies, the on-resistance tends to be dominated by the resistances of the three primary regions/segments $L_{GS}$, $L_G$, $L_{GD}$. In contrast, for RF transistor amplifiers that operate at higher frequencies, the on-resistance tends to be dominated by the lumped resistances between the source/drain contacts and their corresponding source/drain regions, and by the lumped resistances between the source/drain regions and the 2DEG channel (herein "the 2DEG access resistances"). Since the lumped resistances do not scale linearly with frequency, it can be difficult to meet customer requirements for on-resistance values, particularly for RF transistor amplifiers that operate at very high frequencies (e.g., frequencies above 70 GHz).

Pursuant to embodiments of the present invention, Group III nitride-based RF transistor amplifiers are provided that may exhibit reduced 2DEG access resistances, and hence lower on-resistance values. The reduced on-resistance is achieved through a novel doping scheme that allows formation of precisely-aligned double-implanted source/drain regions that provide a smooth doping transition between the source/drain regions and the 2DEG channel. The smoothed transitions between the source/drain regions and the 2DEG channel may reduce the lumped resistances associated with these interfaces, thereby reducing the on-resistance while maintaining good device performance.

The source/drain regions are highly doped regions that are formed by ion implantation in the Group III nitride semiconductor layer structure. Conventionally, the source/drain regions are formed via ion implantation using a hard mask such as a metal (e.g., gold) or semiconductor (e.g., silicon) to define the regions that are implanted. The hard mask ensures that the dopant ions injected during the ion implantation step do not enter regions of the semiconductor layer structure that should not be doped during the ion implantation process. However, since a hard mask is used, only a single implant can be performed, as the hard mask cannot be selectively etched subsequent to the ion implantation. While the hard mask may be removed and another hard mask formed thereafter that could be used in a second ion implantation process, process tolerances will often lead to misalignment of the two implanted regions.

According to embodiments of the present invention, a photoresist (e.g., a carbon-based organic material) may be used as an ion implantation mask for forming the source/drain regions. In some embodiments, the photoresist may be patterned to include at least one opening, and then an ion implantation process may be performed to form a first implanted region in the semiconductor layer structure that is exposed through the opening in the photoresist pattern. The photoresist may then be further patterned to enlarge the first opening and additional ions may be implanted to form a first auxiliary implanted region in the semiconductor layer structure. In other embodiments, a photoresist pattern may be formed on the device and then an ion implantation process may be performed to form the first auxiliary implanted region and to also form a preliminary first implanted region in the semiconductor layer structure. The photoresist may then be expanded using a chemical process to cover the first auxiliary implanted region, and additional ions may be implanted to convert the preliminary first implanted region into a first implanted region in the semiconductor layer structure. In either case, the first implanted region and the first auxiliary implanted region may together form a source/drain region.

The first auxiliary implanted region may be used to reduce the access resistance between the 2DEG channel and the first implanted region. In particular, the first auxiliary implanted region may have a relatively smoothly graded doping profile along the transverse direction. The smoothed doping profile provides a bent conduction band so that the Fermi level of the 2DEG channel smoothly transitions to the Fermi level of the first implanted region, which acts to reduce the lumped resistance associated with the interface between the 2DEG channel and the source/drain region. The first auxiliary implanted region will also typically reduce the distributed resistance $L_{GD}$ since a portion of the semiconductor layer structure that contributes to resistance $L_{GD}$ is more highly doped (and hence has lower resistance). However, at very high frequencies, the primary reduction in the on-resistance may result from the reduction in the above-described lumped 2DEG access resistance.

The Group III nitride-based RF transistor amplifiers according to some embodiments of the present invention may have source/drain regions that are asymmetrical with respect to the lower surfaces of their corresponding source/drain contacts. For example, the RF transistor amplifiers according to embodiments of the present invention may have a first source/drain region that extends a first distance from a lower edge of the inner sidewall of the first source/drain contact towards the second source/drain region and that extends a second distance along the transverse axis from a lower edge of the outer sidewall of the first source/drain contact away from the second source/drain region, where the first distance exceeds the second distance. For example, the first distance may be between 10% and 50% larger than the second distance, or be between 20% and 40% larger than the second distance.

The Group III nitride-based RF transistor amplifiers according to embodiments of the present invention may exhibit reduced on-resistance values and hence may exhibit higher drain currents during on-state operation. This reduction in the on-resistance may be obtained without any appreciable reduction in the gain, drain efficiency or the power added efficiency of the RF transistor amplifier.

According to further embodiments of the present invention, methods of forming a high electron mobility transistors are provided in which a semiconductor layer structure is formed that comprises a Group III nitride-based channel layer and a Group III nitride-based barrier layer that has a higher bandgap than the Group III nitride-based channel layer on an upper surface of the Group III nitride-based channel layer. A photoresist is formed on an upper surface of the semiconductor layer structure, and a first opening is then formed in the photoresist. Dopant ions are implanted into the semiconductor layer structure through the first opening to form a first implanted region in the semiconductor layer structure. Thereafter, the first opening in the photoresist is enlarged (e.g., by etching) to create an expanded first opening. Additional dopant ions are then implanted into the semiconductor layer structure through the expanded first opening using the photoresist as an ion implantation mask to form a first auxiliary implanted region in the semiconductor layer structure and to implant additional ions into the first implanted region.

According to additional embodiments of the present invention, methods of forming a high electron mobility transistor are provided in which a semiconductor layer structure is formed that comprises a Group III nitride-based channel layer and a Group III nitride-based barrier layer that has a higher bandgap than the Group III nitride-based channel layer on an upper surface of the Group III nitride-based channel layer. A photoresist is formed on an upper surface of the semiconductor layer structure, and a first opening is formed in the photoresist. Dopant ions are implanted into the semiconductor layer structure through the first opening to form a first auxiliary implanted region in the semiconductor layer structure and to form a preliminary first implanted region in the semiconductor layer structure. A process is performed that expands the size of the photoresist to shrink a size of the first opening in the photoresist to create a narrowed first opening. Then, additional ions are implanted into the semiconductor layer structure through the narrowed first opening using the photoresist as an ion implantation mask to convert the preliminary first implanted region into a first implanted region.

Embodiments of the present invention will be described in greater detail below with reference to FIGS. 2A-10B.

Figure 2A:
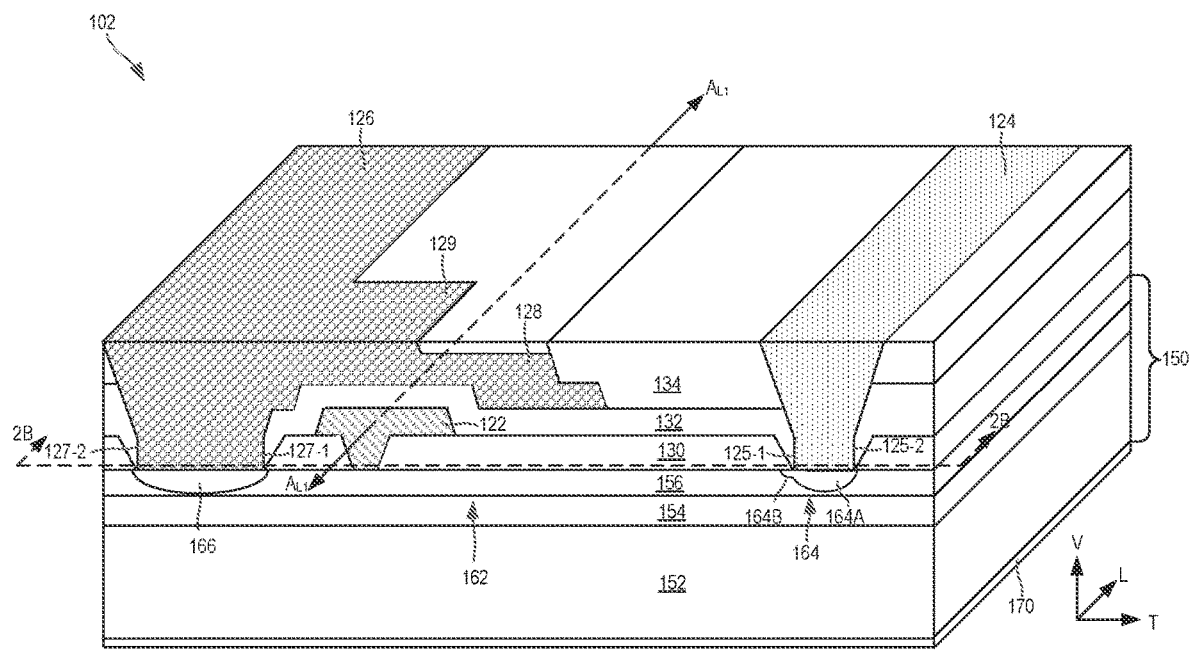
FIG. 2A is a schematic perspective view of a unit cell of a Group III nitride-based RF transistor amplifier according to embodiments of the present invention.

FIG. 2A is a schematic perspective view of a unit cell 102 of a Group III nitride-based RF transistor amplifier according to embodiments of the present invention. As shown in FIG. 2A, the unit cell 102 includes a gate contact 122, a drain contact 124 and a source contact 126 that are each formed on an upper surface of a semiconductor layer structure 150. Longitudinal axes of the respective gate, drain and source contacts 122, 124, 126 extend in parallel to each other in the longitudinal direction L, with the gate contact 122 being positioned between the drain contact 124 and the source contact 126 along the transverse direction T. A first longitudinal axis $A_{L1}$ that is defined by the gate contact 122 is shown for reference in FIG. 2A. Herein, the gate contact 122 may also be referred to as a "gate finger" 122, and the drain and source contacts 124, 126 may be referred to generically as "source/drain contacts." It will be understood that the term "source/drain contact" may refer to either a source contact or a drain contact. A first inter-metal insulation layer 130 electrically isolates the gate, drain and source contacts 122, 124, 126 from each other. A second inter-metal insulation layer 132 covers the gate contact 122 in an active region of the device, and a field plate 128 is formed on the second inter-metal insulation layer 132. The field plate 128 may be positioned above the semiconductor layer structure 150 in the region between the gate contact 122 and the drain contact 124, and may overlap the gate contact 122. The field plate 128 is electrically connected to the source contact 126 by a field plate extension 129. While only one field plate extension 129 is depicted in FIG. 2A, it will be appreciated that multiple spaced-apart field plate extensions 129 (e.g., spaced apart along the L direction) may be provided that connect the field plate 128 to the source contact 126 in multiple locations. It will also be appreciated that the field plate extension 129 may be omitted in some embodiments and the filed plate 128 may be connected to the source contact in a different manner (e.g., outside of an active region of the device).

The semiconductor layer structure 150 includes a substrate 152 and a plurality of epitaxial layers that are grown on the substrate 152. The epitaxial layers include at least a channel layer 154 and a barrier layer 156. The barrier layer 156 may be an undoped or lightly doped n-type semiconductor layer (or a multilayer structure). A heavily doped drain region 164 is formed in the barrier layer 156 underneath the drain contact 124, and a heavily doped source region 166 is formed in the barrier layer 156 underneath the source contact 126. Herein, the drain and source regions 164, 166 may be referred to generically as a "source/drain region." It will be understood that the term "source/drain region" may refer to either a source region or a drain region. The heavily doped drain region 164 and the heavily doped source region 166 may be formed in the barrier layer 156, and may optionally extend into the channel layer 154. The drain region 164 and the source region 166 may each have a maximum doping density of, for example, at least $1\times10^{19}$ dopants/cm$^3$. In some embodiments, the maximum doping density of the drain region 164 and the source region 166 may each be at least $3\times10^{19}$ dopants/cm$^3$, at least $5\times10^{19}$ dopants/cm$^3$ or at least $1\times10^{20}$ dopants/cm$^3$.

A backside source contact 170 is formed on the lower side of the semiconductor layer structure 150. A plurality of vias 146 (see FIG. 3A) are formed through the semiconductor layer structure 150, and the material of the backside source contact 170 may line or fill these vias 146. The source contact 126 may contact the material of the backside source contact 170 that is within the vias 146 to electrically connect the source contact 126 to the backside source contact 170.

When the gate, drain and source contacts 122, 124, 126 are connected to suitable direct current bias voltages and an RF signal is applied to the gate contact 122, a two dimensional electron gas (2DEG) is induced in the channel layer 154 at a junction between the channel layer 154 and the barrier layer 156. The 2DEG acts as a highly conductive channel 162 (also referred to herein as a "channel region 162") that allows conduction between the source region 166 and the drain region 164.

As can be seen by comparing FIGS. 1 and 2A, the unit cell 102 of FIG. 2A differs from the conventional unit cell 2 of FIG. 1 at least in that the drain region 164 includes both a main region 164A and an extension region 164B that extends inwardly toward the gate finger 122. This extension region 164B is formed on only one side of the main region 164A, namely the inner side. As a result, the drain region 164 may be asymmetric with respect to the drain contact 124 when the unit cell 102 is viewed from above, as will be discussed in greater detail below. A multiple ion implantation process may be used to form the drain region 164, with one of the two implantation steps being used to substantially form the main region 164A, and the other implantation step being used to form the extension region 164B (and to also implant additional ions into the main region 164A) in example embodiments.

Figure 2B:
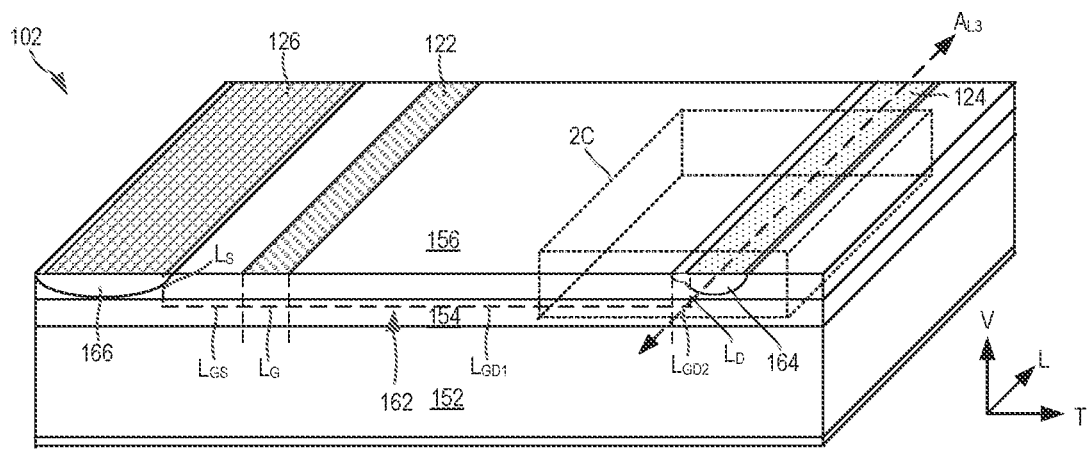
FIG. 2B is a schematic horizontal cross-sectional view taken along line 2B-2B of FIG. 2A.
Figure 2C:
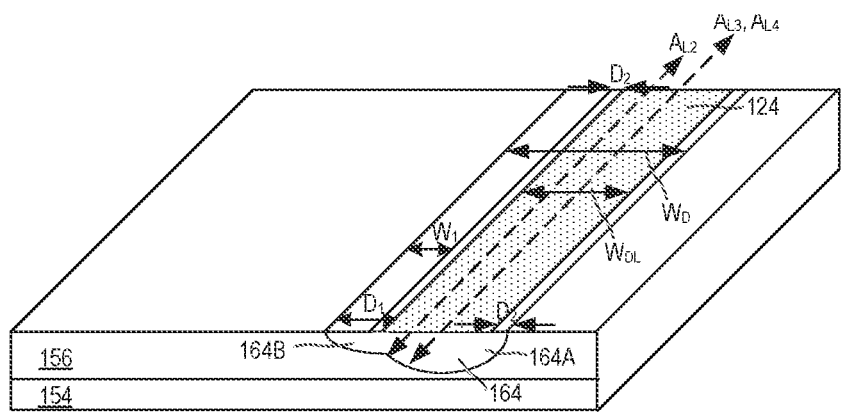
FIG. 2C is an enlarged view of the portion of FIG. 2B outlined in the dotted box labelled 2C in FIG. 2B.

FIG. 2B is a schematic horizontal cross-sectional view taken along line 2B-2B of FIG. 2A. The cross-section of FIG. 2B is taken along the plane defined by the top surface of the semiconductor layer structure 150. For clarity, the locations of the bottom surfaces of the gate, drain and source contacts 122, 124, 126 are shown in FIG. 2B even through these contacts are actually just above the cross-section of FIG. 2B. FIG. 2C is an enlarged view of the portion of FIG. 2B outlined in the dotted box labelled 2C in FIG. 2B.

As shown in FIG. 2B, the unit cell 102 has a conduction path between the source region 166 and the drain region 164 over which carriers pass when appropriate bias voltages are applied to the device. This conduction path is shown in FIG. 2B and includes a total of six regions (or segments when viewed in cross-section), namely four primary regions/segments $L_{GS}$, $L_G$, $L_{GD1}$, $L_{GD2}$ and two additional regions/segments $L_S$, $L_D$. Regions/segments $L_{GS}$, $L_G$, $L_S$, and $L_D$ may be the same as the corresponding regions/segments of the conventional unit cell 2 described above with reference to FIG. 1, and hence further description thereof will be omitted. As shown in FIG. 2B, region/segment $L_{GD}$ of the conventional unit cell 2 is replaced in unit cell 102 with two regions/segments $L_{GD1}$, $L_{GD2}$. Region/segment $L_{GD1}$ generally corresponds to region/segment $L_{GD}$ of the conventional unit cell 2 except that region/segment $L_{GD1}$ is shorter than region/segment $L_{GD}$ of the conventional unit cell 2. Region/segment $L_{GD2}$ corresponds to the above-discussed inner extension region 164B of the drain region 164.

FIG. 2C illustrates the drain region 164 and the lowermost surface of the drain contact 124 in greater detail. As shown in FIG. 2C, the drain region 164 includes the main region 164A and the extension region 164B. Herein, the main region 164A may also be referred to as a first implanted region 164A, and the extension region 164B may also be referred to as a first auxiliary implanted region 164B. A top surface of the drain region 164 has a width $W_D$ along the transverse axis T that is greater than a width $W_{DC}$ of the lower surface of the drain contact 124. The longitudinal axes of the drain region 164 and the drain contact are not aligned. In particular, a second longitudinal axis $A_{L2}$ that extends down a center of an upper surface of the drain region 164 may be offset in the transverse direction with respect to a third longitudinal axis $A_{L3}$ that extends down a center of a lower surface of the drain contact 124. Consequently, the upper surface of the drain region 164 extends a first distance $D_1$ past the lower edge of the inner sidewall 125-1 of the drain contact 124 when the device is viewed from above (i.e., when viewed along an axis that is perpendicular to the upper surface of the semiconductor layer structure 150), while the upper surface of the drain region 164 extends a second distance $D_2$ past the lower edge of the outer sidewall 125-2 of the drain contact 124. The first distance $D_1$ exceeds the second distance $D_2$.

The first implanted region 164A of drain region 164 may be formed directly underneath the drain contact 124, and the first implanted region 164A may be axisymmetric with the lower surface of the drain contact 124. In particular, a fourth longitudinal axis $A_{L4}$ that extends down a center of an upper surface of the first implanted region 164A may be directly underneath the third longitudinal axis $A_{L3}$ that extends down a center of a lower surface of the drain contact 124 such that the third longitudinal axis $A_{L3}$ vertically overlaps the fourth longitudinal axis $A_{L4}$. As such, the third longitudinal axis $A_{L3}$ and the fourth longitudinal axis $A_{L4}$ are at the same location along the transverse axis T so that the centerline of the upper surface of the first implanted region 164A is aligned with the centerline of the lower surface of the drain contact 124. The width (i.e., the distance along the transverse axis T) of the upper surface of the first implanted region 164A is slightly larger than the width $W_{DL}$ of the lower surface of the drain contact 124 since the upper surface of the first implanted region 164A extends the distance $D_2$ past the lower edge of each sidewall 125-1, 125-2 of the drain contact 124 when the device is viewed from above (i.e., when viewed along an axis that is perpendicular to the upper surface of the semiconductor layer structure 150). The distance $D_2$ may be, for example, on the order of 0.025-0.25 microns in example embodiments.

The first auxiliary implanted region 164B extends from the inner side of the first implanted region 164A, but a corresponding auxiliary implanted region does not extend from the opposite side of the first implanted region 164A, which is what causes the drain region 164 to not be axisymmetric with the lower surface of the drain contact 124.

A width $W_1$ of the first auxiliary implanted region 164B may be relatively small (note that herein the width of the first auxiliary implanted region 164B is defined as the distance the first auxiliary implanted region 164B extends in the transverse direction beyond the first implanted region 164A). For example, in some embodiments, the width $W_1$ of the first auxiliary implanted region 164B may be between 5% to 40% of the distance $D_2$ that the upper surface of the first implanted region 164A extends past the lower surface of the drain contact 124 when the device is viewed from above. Thus, in this example embodiment, if the distance $D_2$ has a value of 1, the distance $D_1$ is between 1.05 and 1.4. In other embodiments, the width $W_1$ of the first auxiliary implanted region 164B may be between 10% to 25% the distance $D_2$, or between 15% to 20% the distance $D_2$.

A depth of the first auxiliary implanted region 164B may be less than a depth of the first implanted region 164A. In example embodiments, a maximum depth of the first auxiliary implanted region 164B may be less than half of a maximum depth of the first implanted region 164A. In other embodiments, a maximum depth of the first auxiliary implanted region 164B may be less than a third of a maximum depth of the first implanted region 164A. In still other embodiments, a maximum depth of the first auxiliary implanted region 164B may be less than a quarter of a maximum depth of the first implanted region 164A.

A maximum doping concentration of the first auxiliary implanted region 164B may be less than a maximum doping concentration of the first implanted region 164A. In example embodiments, a maximum doping concentration of the first implanted region 164A may exceed a maximum doping concentration of the first auxiliary implanted region 164B by at least 25% (i.e., if the doping concentration of the first auxiliary implanted region 164B is $1 \times 10^{19}$, then the maximum doping concentration of the first implanted region 164 is at least $1.25 \times 10^{19}$). In other embodiments, a maximum doping concentration of the first implanted region 164A may exceed a maximum doping concentration of the first auxiliary implanted region 164B by at least 50%. In still other embodiments, a maximum doping concentration of the first implanted region 164A may be at least twice a maximum doping concentration of the first auxiliary implanted region 164B.

Because of the difference in the doping concentrations, the average sheet resistance of the first auxiliary implanted region 164B may be at least 25% greater than the average sheet resistance first implanted region 164A. In some embodiments, the average sheet resistance of the first auxiliary implanted region 164B may be between 25% and 200% greater than the average sheet resistance of the first implanted region 164A (i.e., if the average sheet resistance of the first implanted region 164A is 70 ohm-cm$^2$, then the average sheet resistance of the first auxiliary implanted region 164B is between 87.5 and 210 ohm-cm$^2$). In other embodiments, the average sheet resistance of the first auxiliary implanted region 164B may be between 30% and 150% greater than the average sheet resistance first implanted region 164A. In still other embodiments, the average sheet resistance of the first auxiliary implanted region 164B may be between 40% and 100% greater than the average sheet resistance first implanted region 164A.

The 2DEG channel may have an average sheet resistance that is at least twice the average sheet resistance of the first auxiliary implanted region 164B and at least 3.5 times the average sheet resistance of the first implanted region 164A. For example, the 2DEG channel may have an average sheet resistance that is between two times and five times the average sheet resistance of the first auxiliary implanted region 164B and/or between 3.5 times and seven times the average sheet resistance of the first implanted region 164A. In other embodiments, the 2DEG channel may have an average sheet resistance that is between three and four times the average sheet resistance of the first auxiliary implanted region 164B and/or between five and six times the average sheet resistance of the first implanted region 164A.

Since the first auxiliary implanted region 164B replaces a portion of the 2DEG channel 162 and has a lower sheet resistance than the 2DEG channel 162, the first auxiliary implanted region 164B acts to lower the on-resistance. However, the width of the first auxiliary implanted region 164B may be small compared to the width of the 2DEG channel 162, and hence the reduction in the on-resistance due to the lowered sheet resistance may be small. The primary reduction in the on-resistance exhibited by the RF transistor amplifiers according to embodiments of the present invention may be achieved because the first auxiliary implanted region 164B acts to smooth the transition between the 2DEG channel 162 and the drain region 164 by smoothing the doping profile between the 2DEG channel 162 and the first implanted region 164A. As discussed above, the smoothed doping profile provides a bent conduction band so that the Fermi level of the 2DEG channel smoothly transitions to the Fermi level of the first implanted region, which acts to reduce the lumped resistance associated with the interface between the 2DEG channel and the source/drain region.

Applicants have discovered that extending the width of the first auxiliary implanted region 164B too far may actually increase the on-resistance of the RF transistor amplifier even though such a design replaces a greater portion of the high resistivity 2DEG channel with lower resistivity first implanted region 164B. While not intending to be bound by any theory of operation, Applicants believe that the increase in the on-resistance may occur as the width of the first auxiliary implanted region 164B is extended beyond a certain distance because the reduction in resistance provided by the lengthened region with lower sheet resistance is offset by the fact that the lumped resistance associated with the interface between the 2DEG channel 162 and the first implanted region 164A is reduced less. Such an effect is non-intuitive and unexpected.

Another potential disadvantage of increasing the width of the first auxiliary implanted region 164B is that this acts to reduce the breakdown voltage of the RF transistor amplifier 100. Since the width $W_1$ of the first auxiliary implanted region 164B may be small, the decrease in the breakdown voltage of the RF transistor amplifiers according to embodiments of the present invention may also be small.

In some embodiments, the location of the peak doping density of the drain region 164 may be directly below the third longitudinal axis $A_{L3}$ that extends down a center of the lower surface of the drain contact 124. The location of the peak doping density of the drain region 164 may be closer to the edge of the drain region 164 that is adjacent the lower edge of the outer sidewall 125-2 of the drain contact 124 than it is to the lower edge of the inner sidewall 125-1 of the first drain contact 124.

The use of source/drain regions that extend beyond the lower edge of the inner sidewalls of source/drain contacts is known in the art. In particular, MOSFETs having ultra-short channel regions are known that have both a regular drain region underneath the drain contact and also have a so-called "lightly-doped drain region" that extends inwardly from the regular drain region toward the gate contact. These lightly-doped drain regions typically (1) are doped more lightly than the regular drain regions, (2) have a shallower depth than the regular drain regions, and (3) extend underneath the gate finger (i.e., the gate finger vertically overlaps the lightly-doped drain region). The provision of the lightly-doped drain region lowers the electric field in the channel in the vicinity of the regular drain region, which may reduce hot carrier injection effects where carriers gain sufficient kinetic energy that they may be injected into the gate dielectric layer of the MOSFET where the carriers may degrade the gate dielectric layer, which may lead to adverse effects such as increased leakage currents and/or premature breakdown of the gate dielectric layer.

The provision of the first auxiliary drain region 164B included in the RF transistor amplifiers according to embodiments of the present invention may be provided for a completely different purpose, namely to reduce the on-resistance of the RF transistor amplifier. The first auxiliary drain region 164B may be much shorter than a conventional lightly-doped drain region, and may not extend underneath the gate electrode like most lightly-doped drain regions. Additionally, the first auxiliary drain region 164B included in the RF transistor amplifiers according to embodiments of the present invention may have a different doping density as compared to the lightly-doped drain regions used in conventional MOSFETs. Additionally, most high electron mobility transistors do not have a gate dielectric layer (and even if they do, defects in the gate dielectric do not result in a short circuit condition), and hence the hot carrier injection effects that give rise to the use of lightly-doped drain regions in conventional MOSFETs are not present in high electron mobility transistors.

Figure 3A:
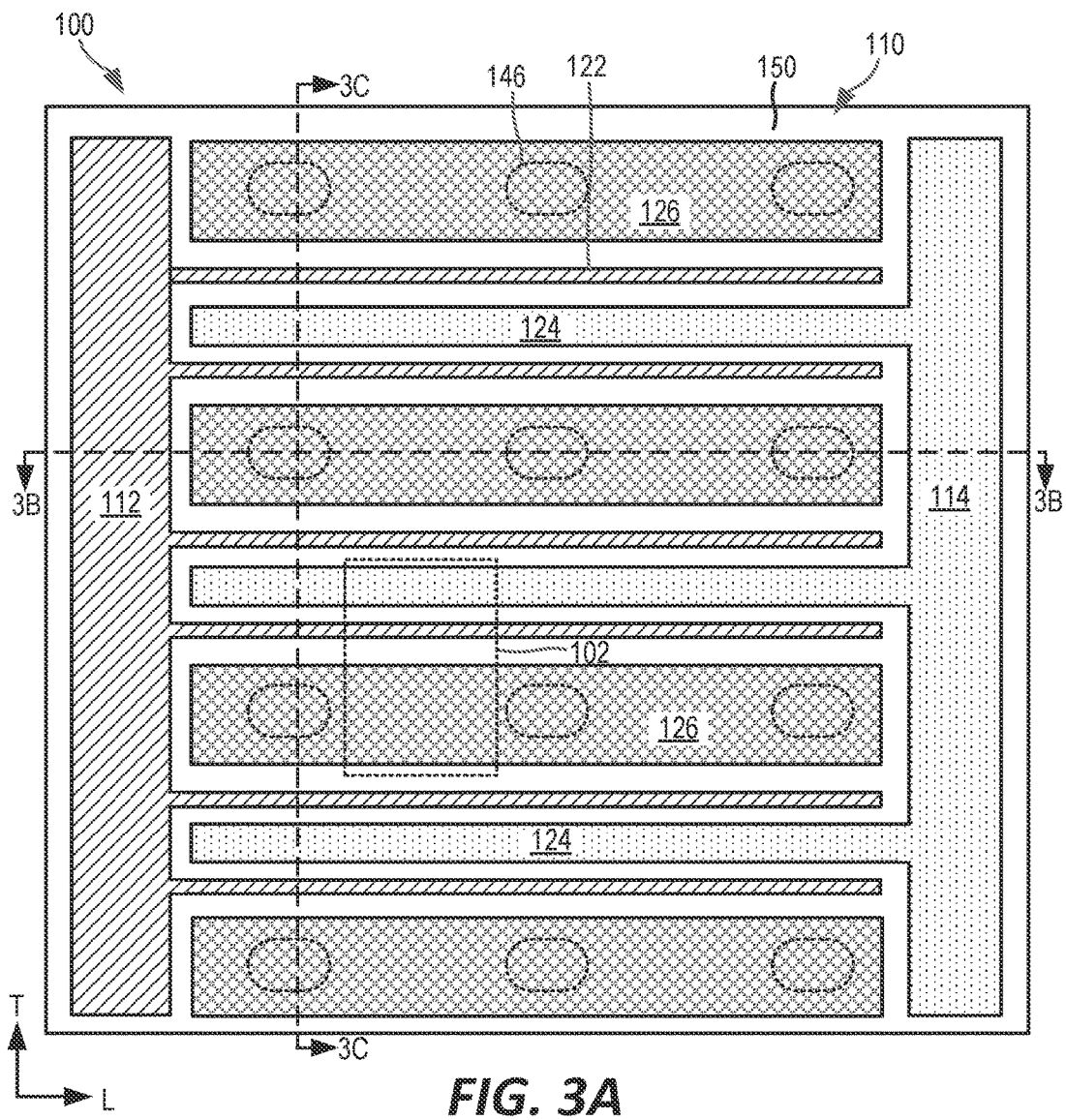
FIG. 3A is a schematic plan view of a Group III nitride-based RF transistor amplifier die according to embodiments of the present invention that includes unit cells having the design of FIGS. 2A-2B. The view of FIG. 3A is taken just above the top surface of the semiconductor layer structure to illustrate the lowest level of the contact metallization.
Figure 3B:
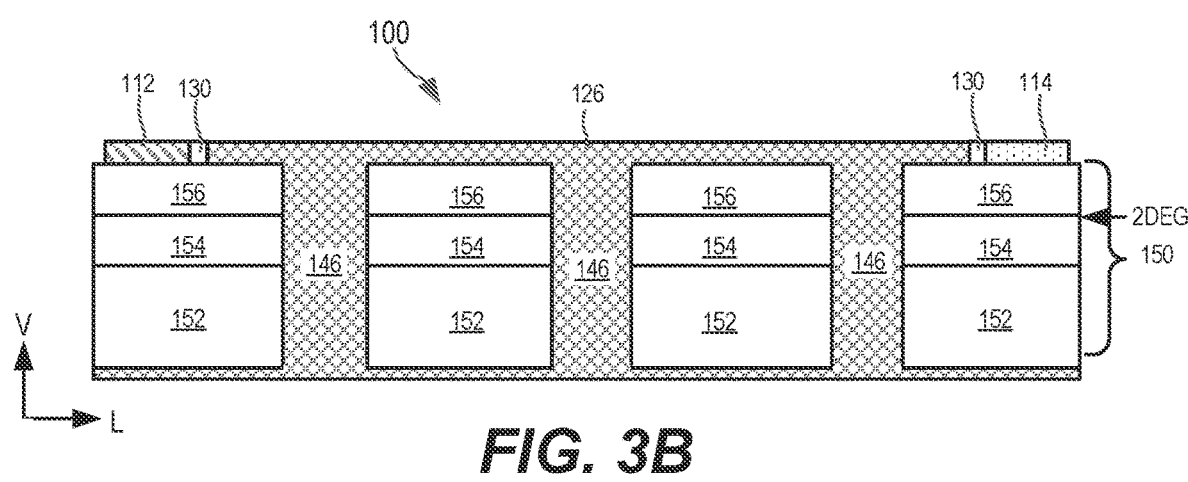
FIG. 3B is a schematic cross-sectional view taken along line 3B-3B of FIG. 3A.
Figure 3C:
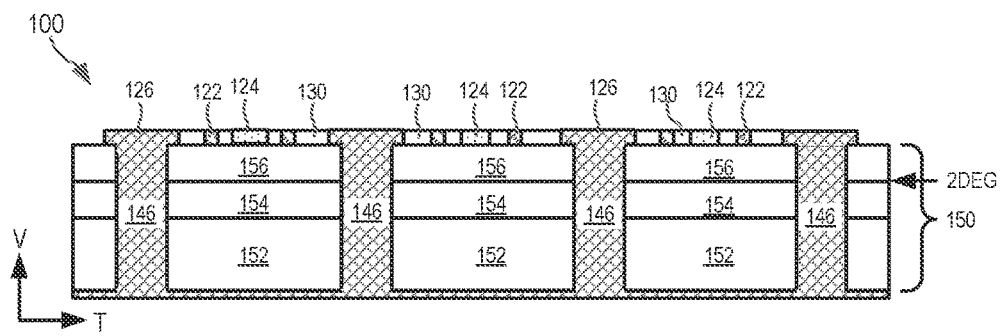
FIG. 3C is a schematic cross-sectional view taken along line 3C-3C of FIG. 3A.

FIGS. 3A through 3C are various views that schematically illustrate the Group III nitride-based RF transistor amplifier die 100 that includes the unit cell 102 discussed above with reference to FIG. 2. In particular, FIG. 3A is a schematic plan view of the RF transistor amplifier die 100. In FIG. 3A, only the lowermost portion of the metallization formed on the upper surface of the semiconductor layer structure 150 is shown. FIGS. 3B are 3C are schematic cross-sectional views of the RF transistor amplifier die 100 taken along lines 3B-3B and 3C-3C of FIG. 3A, respectively. It will be appreciated that FIGS. 3A-3C (and many of the other figures of the present application) are highly simplified diagrams, and that actual RF transistor amplifiers may include many more unit cells and various circuitry and elements that are not shown in the simplified figures herein.

As shown in FIG. 3A, the metallization that is formed directly on the upper surface of the semiconductor layer structure 150 includes a gate bus 112 and a drain bus 114, a plurality of gate fingers 122, a plurality of drain contacts 124 and a plurality of source contacts 126. The gate fingers 122, drain contacts 124 and source contacts 126 may extend in parallel to each other, with the gate fingers 122 extending from the gate bus 112 in a first direction and the drain contacts 124 extending from the drain bus 114 in a direction opposite the first direction. Each gate finger 122 may be positioned between a drain contact 124 and a source contact 126.

The gate bus 112 and the gate fingers 122 may be implemented as a first monolithic metal pattern. The gate fingers 122 may be formed of materials that are capable of making a Schottky contact to a Group III nitride-based semiconductor material, such as Ni, Pt, Cu, Pd, Cr, W and/or WSiN. The gate bus 112 and the gate fingers 122 are part of a gate electrode structure of the RF transistor amplifier die 100. The upper portion (not shown) of the gate electrode may act as the gate terminal of the RF transistor amplifier die 100. A first circuit element (not shown) may be connected to the gate terminal by, for example, bond wires (not shown). The first circuit element may pass an input RF signal that is to be amplified to the RF transistor amplifier die 100.

The drain bus 114 and the drain contacts 124 may be implemented as a second monolithic metal pattern. The drain contacts 124 may include a metal, such as TiAlN, that can form an ohmic contact to Group III nitride-based materials. The drain bus 114 and the drain contacts 124 are part of a drain electrode of the RF transistor amplifier die 100. The upper portion (not shown) of the drain electrode may act as a drain terminal of the RF transistor amplifier die 100. A second circuit element (not shown) may be connected to the drain terminal by, for example, bond wires (not shown). The second circuit element may receive an amplified RF signal that is output by the RF transistor amplifier die 100.

The source contacts 126 may include a metal, such as TiAlN, that can form an ohmic contact to Group III nitride-based materials. The source contacts 126 are physically and electrically connected to a source terminal (not shown) of the RF transistor amplifier die 100 that is located on the bottom side of the semiconductor layer structure 150 by a plurality of metal-plated source vias 146. Each metal-plated source via 146 may extend through the semiconductor layer structure 150. Each metal-plated source via 146 may each be implemented by forming openings though the semiconductor layer structure 150 (e.g., by anisotropic etching) and by then depositing metal-plating that coats the sidewalls of the openings (or which completely fill the openings so that the metal-plated vias are metal-filled vias). It will also be appreciated that in some cases the source terminal may be formed on the upper surface of the semiconductor layer structure 150, in which case the vias 146 may be omitted.

As described above with reference to FIGS. 2A-2B, various inter-metal insulating layers and/or passivation layers 130, 132, 134 may be formed that isolate the gate metallization 112, 122, the drain metallization 114, 124 and the source metallization 126 from each other. The inter-metal insulating layers and/or passivation layers 130, 132, 134 may include a dielectric material, such as SiN, $SiO_2$, etc.

The RF transistor amplifier die 100 includes a plurality of unit cell transistors 102, one of which was discussed above with reference to FIGS. 2A-2C. The location of the unit cell 102 of FIGS. 2A-2C is indicated in the dashed box in FIG. 3A. The unit cell transistor 102 includes a gate finger 122, a portion of a drain contact 124 and a portion of a source contact 126 along with the portions of the semiconductor layer structure 150 underlying the identified gate finger 122, drain contact 124 and source contact 126. Since all of the gate fingers 122 are electrically connected to a common gate bus 112, all of the drain contacts 124 are electrically connected to a common drain bus 114, and all of the source contacts 126 are electrically connected to a common source terminal, it can be seen that the unit cell transistors 102 are all electrically connected together in parallel.

The RF transistor amplifier die 100 may comprise a Group III nitride-based HEMT RF transistor amplifier. Suitable structures for Group III-nitride-based HEMT devices that may utilize embodiments of the present invention are described, for example, in commonly assigned U.S. Patent Publication No. 2002/0066908A1 published Jun. 6, 2002, for "Aluminum Gallium Nitride/Gallium Nitride High Electron Mobility Transistors Having A Gate Contact On A Gallium Nitride-based Cap Segment And Methods Of Fabricating Same," U.S. Patent Publication No. 2002/0167023A1 for "Group-III Nitride-based High Electron Mobility Transistor (HEMT) With Barrier/Spacer Layer," published Nov. 14, 2002, U.S. Patent Publication No. 2004/0061129 for "Nitride-Based Transistors And Methods Of Fabrication Thereof Using Non-Etched Contact Recesses," published on Apr. 1, 2004, U.S. Pat. No. 7,906,799 for "Nitride-Based Transistors With A Protective Layer And A Low-Damage Recess" issued Mar. 15, 2011, and U.S. Pat. No. 6,316,793 entitled "Nitride-based Transistors On Semi-Insulating Silicon Carbide Substrates," issued Nov. 13, 2001, the disclosures of which are hereby incorporated herein by reference in their entirety.

FIGS. 3B and 3C illustrate the semiconductor layer structure 150 in more detail. As shown in FIGS. 3B and 3C, the semiconductor layer structure 150 includes a plurality of semiconductor layers. In the depicted embodiment, a total of two semiconductor layers are shown, namely a channel layer 154 and a barrier layer 156 that is on a top side of the channel layer 154. The semiconductor layer structure 150 may (and typically will) include additional semiconductor and/or non-semiconductor layers. For example, the semiconductor layer structure 150 may include a growth substrate 152 on which the other semiconductor layers are grown. The growth substrate 152 may comprise, for example, a 4H-SiC or 6H-SiC substrate. In other embodiments, the growth substrate 152 may be comprise a different semiconductor material (e.g., silicon or a Group III nitride-based material, GaAs, ZnO, InP) or a non-semiconductor material (e.g., sapphire). The growth substrate 152, even if formed of a non-semiconductor material, is considered to be part of the semiconductor layer structure 150.

Optional buffer, nucleation and/or transition layers (not shown) may be provided on the growth substrate 152 beneath the channel layer 154. For example, an AlN buffer layer may be included to provide an appropriate crystal structure transition between a SiC growth substrate 152 and the remainder of the semiconductor layer structure 150. Additionally, strain balancing transition layer(s) may also be provided as described, for example, in commonly assigned U.S. Patent Publication 2003/0102482A1, published Jun. 5, 2003, and entitled "Strain Balanced Nitride Heterojunction Transistors And Methods Of Fabricating Strain Balanced Nitride Heterojunction Transistors," the disclosure of which is incorporated herein by reference as if set forth fully herein.

In some embodiments, the channel layer 154 is a Group III nitride material, such as $Al_xGa_{1-x}N$ where $0 \leq x < 1$, provided that the energy of the conduction band edge of the channel layer 154 is less than the energy of the conduction band edge of the barrier layer 156 at the interface between the channel and barrier layers 154, 156. In certain embodiments of the present invention, x=0, indicating that the channel layer 154 is gallium nitride ("GaN"). The channel layer 154 may also be other Group III nitrides such as InGaN, AlInGaN or the like. The channel layer 154 may be undoped or unintentionally doped and may be grown to a thickness of, for example, greater than about 20 Å. The channel layer 154 may also be a multi-layer structure, such as a superlattice or combinations of GaN, AlGaN or the like.

The barrier layer 156 may be a Group III nitride and may have a bandgap larger than that of the channel layer 154 and a smaller electron affinity than the channel layer 154. Accordingly, in certain embodiments of the present invention, the barrier layer 156 may include AlGaN, AlInGaN and/or AlN or combinations of layers thereof. The barrier layer 156 may, for example, be from about 0.1 nm to about 30 nm thick. In certain embodiments, the barrier layer 156 is undoped or doped with an n-type dopant to a concentration less than about $10^{19}$ cm$^{-3}$. In some embodiments of the present invention, the barrier layer 156 is $Al_xGa_{1-x}N$ where $0 < x < 1$. For example, the aluminum concentration may be between about 5% and about 100%. In particular embodiments, the barrier layer 156 is thick enough and has a high enough Al composition and doping to induce a significant carrier concentration at the interface between the channel layer 154 and the barrier layer 156.

Due to the difference in bandgap between the barrier layer 156 and the channel layer 154 and piezoelectric effects at the interface between the barrier layer 156 and the channel layer 154, a two-dimensional electron gas (2DEG) is induced in the channel layer 154 at a junction between the channel layer 154 and the barrier layer 156. The 2DEG acts as a highly conductive layer that allows conduction between the source region of each unit cell transistor 102 and its associated drain region.

Figure 4:
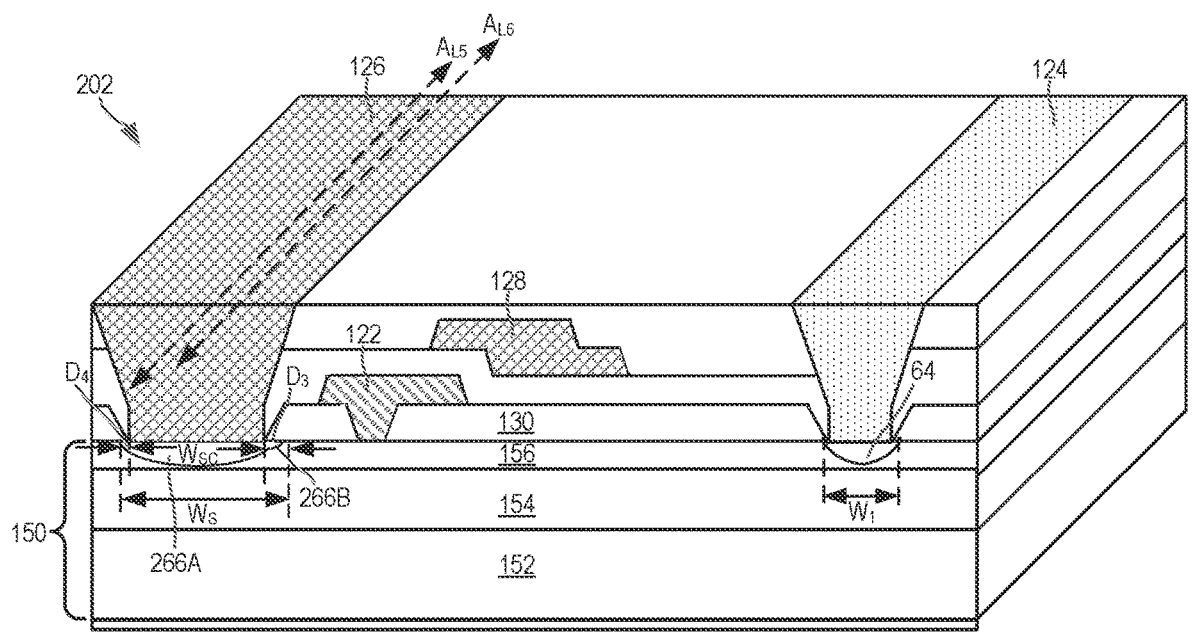
FIG. 4 is a schematic perspective view of a unit cell of a Group III nitride-based RF transistor amplifier die according to further embodiments of the present invention.

FIG. 4 is a schematic perspective view of a unit cell 202 of a Group III nitride-based RF transistor amplifier according to further embodiments of the present invention. The unit cell 202 is very similar to the unit cell 102 of FIGS. 2A-2C, except that the unit cell 202 has (1) a drain region 64 having the conventional design of unit cell 2 (FIG. 1) and (2) a widened source region 266. The discussion below will focus on the differences between unit cell 202 and unit cell 102.

As shown in FIG. 4, the source region 266 includes a main region 266A that is also referred to herein as a second implanted region 266A and an extension region 266B that is also referred to herein as a second auxiliary implanted region 266B.

A top surface of the source region 266 has a width $W_S$ along the transverse axis T that is greater than a width $W_{SC}$ of the lower surface of the source contact 126. The longitudinal axes of the source region 266 and the source contact 126 are not aligned. In particular, a fifth longitudinal axis $A_{L5}$ that extends down a center of an upper surface of the source region 266 may be offset in the transverse direction with respect to a sixth longitudinal axis $A_{L6}$ that extends down a center of a lower surface of the source contact 126. Consequently, the upper surface of the source region 266 extends a third distance $D_3$ past the lower edge of the inner sidewall 127-1 of the source contact 126 when the device is viewed from above, while the upper surface of the source region 266 extends a fourth distance $D_4$ past the lower edge of the outer sidewall 127-2 of the source contact 126. The third distance $D_3$ exceeds the fourth distance $D_4$.

A width of the second auxiliary implanted region 266B (which corresponds to the width $W_1$ of the first auxiliary drain region 164B that is discussed above) may be relatively small. For example, in some embodiments, the width of the second auxiliary implanted region 266B may be between 5% to 40% of the distance $D_3$. In other embodiments, the width of the second auxiliary implanted region 266B may be between 10% to 25% the distance $D_3$, or between 15% to 20% the distance $D_3$.

Relative depths, relative maximum doping concentrations, and relative sheet resistances of the second auxiliary implanted region 266B and the second implanted region 266A may be the same as the relative depths, relative maximum doping concentrations and relative sheet resistances of the first auxiliary implanted region 164B and the first implanted region 164A described above.

In some embodiments, the location of the peak doping density of the source region 266 may be directly below the fifth longitudinal axis $A_{L5}$ that extends down a center of the lower surface of the source contact 126. The location of the peak doping density of the source region 266 may be closer to the edge of the source region 266 that is adjacent the lower edge of the outer sidewall 127-2 of the source contact 126 than it is to the lower edge of the inner sidewall 127-1 of the source contact 126.

Figure 5:
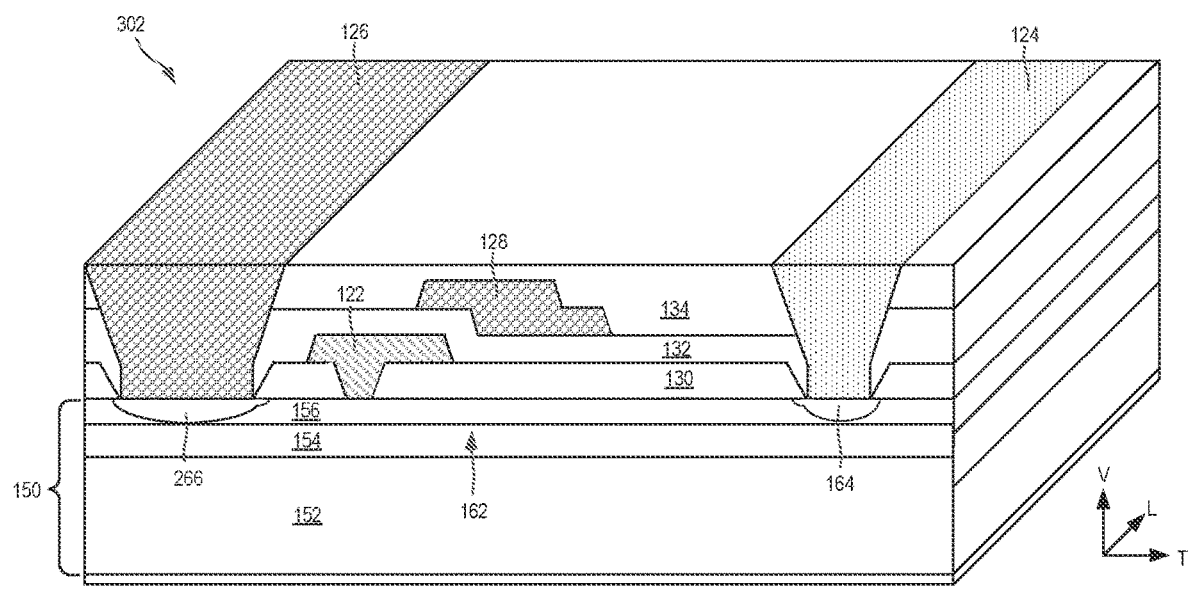
FIG. 5 is a schematic perspective view of a unit cell of a Group III nitride-based RF transistor amplifier die according to still further embodiments of the present invention.

FIG. 5 is a schematic perspective view of a unit cell 302 of a Group III nitride-based RF transistor amplifier die according to still further embodiments of the present invention. The unit cell 302 is very similar to the unit cell 102 of FIGS. 2A-2C, except that the unit cell 302 includes the widened source region 266 of unit cell 202 so that unit cell 302 has both a widened drain region 164 and a widened source region 266. As all aspects of unit cell 302 have been discussed above with respect to either unit cell 102 or unit cell 202, further description thereof will be omitted.

Figure 6A:
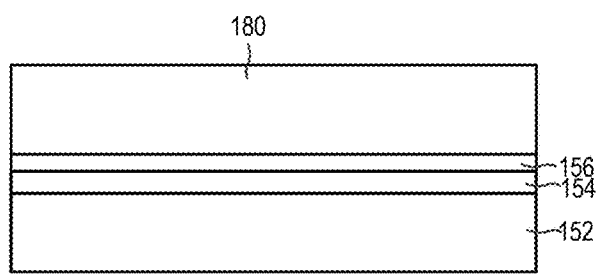
FIGS. 6A-6F are cross-sectional views that schematically illustrate a first method for forming RF transistor amplifier according to embodiments of the present invention.
Figure 6B:
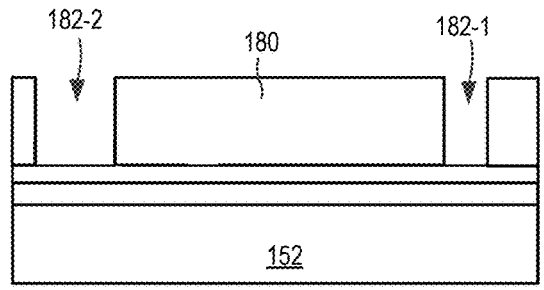
Figure 6C:
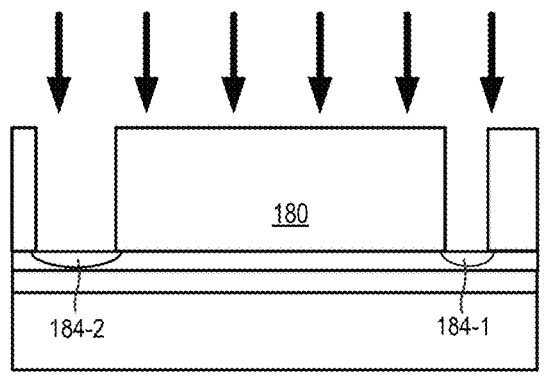

FIGS. 6A-6F illustrate a first example method of manufacturing an RF transistor amplifier according to embodiments of the present invention that is formed of the unit cells 302 of FIG. 5. As shown in FIG. 6A, the semiconductor layer structure 150 (layers 152, 154, 156) may be formed, and then a photoresist mask 180 may be formed to cover the semiconductor layer structure 150. As shown in FIG. 6B, the photoresist mask 180 may then be patterned to form first and second openings 182-1, 182-2 therein that each expose portions of the upper surface of the semiconductor layer structure 150. As shown in FIG. 6C, a first ion implantation process may then be performed to implant dopant ions into the exposed portions of the semiconductor layer structure 150 to form respective preliminary first and second implanted regions 184-1, 184-2.

Figure 6D:
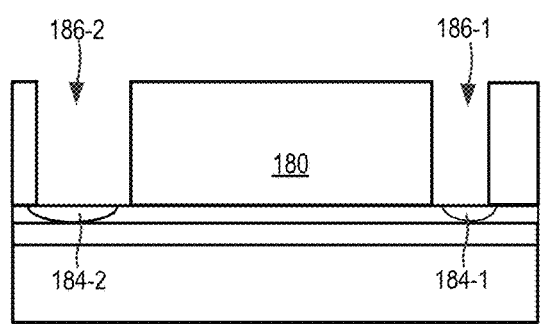
Figure 6E:
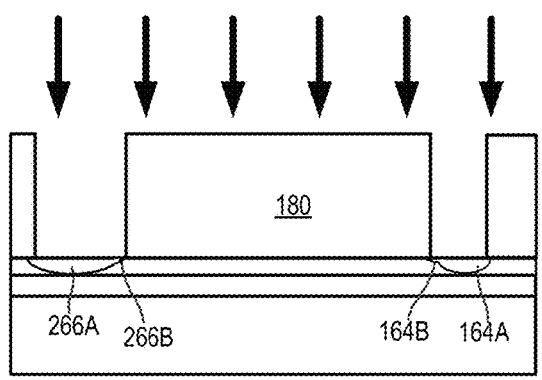
Figure 6F:
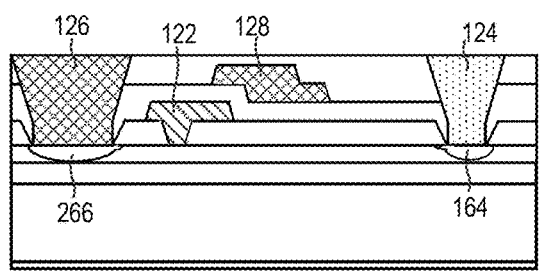

Referring to FIG. 6D, the photoresist mask 180 may then be patterned further to asymmetrically enlarge the first and second openings 182-1, 182-2 so as to form expanded first and second openings 186-1, 186-2. This patterning may be performed, for example, using an oxygen etch. As shown in FIG. 6E, a second ion implantation process may then be performed to implant dopant ions into the exposed portions of the semiconductor layer structure 150. The second ion implantation process acts to form respective first and second auxiliary implanted regions 164B, 266B, and also converts the preliminary first and second implanted regions 184-1, 184-2 into the first and second implanted regions 164A, 266A. As shown in FIG. 6F, the photoresist 180 may then be removed, and the device metallization and interlayer insulating layers may be formed using conventional processing steps.

It will be appreciated that the method illustrated in FIGS. 6A-6F may be modified so that only one of the first or second openings 182-1, 182-2 is enlarged to form RF transistor amplifiers having unit cell designs as shown in FIG. 2A or 4.

Figure 7A:
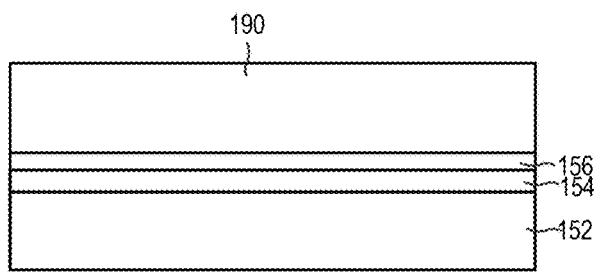
FIGS. 7A-7F are cross-sectional views that schematically illustrate a second method for forming RF transistor amplifier according to embodiments of the present invention.
Figure 7B:
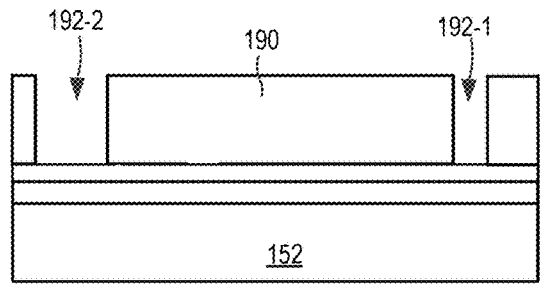
Figure 7C:
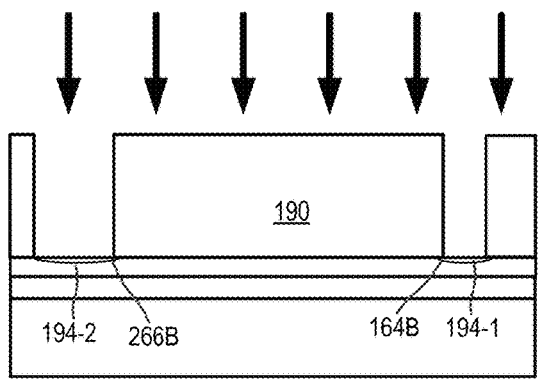

FIGS. 7A-7F illustrate a second example method of manufacturing an RF transistor amplifier according to embodiments of the present invention that is formed of the unit cells 302 of FIG. 5. As shown in FIG. 7A, the semiconductor layer structure 150 may be formed, and then a photoresist mask 190 may be formed to cover the semiconductor layer structure 150. As shown in FIG. 7B, the photoresist mask 190 may then be patterned to form first and second openings 192-1, 192-2 therein that each expose portions of the upper surface of the semiconductor layer structure 150. As shown in FIG. 7C, a first ion implantation process may then be performed to implant dopant ions into the exposed portions of the semiconductor layer structure 150 to form respective first and second auxiliary implanted regions 164B, 266B, and to also form preliminary first and second implanted regions 194-1, 194-2.

Figure 7D:
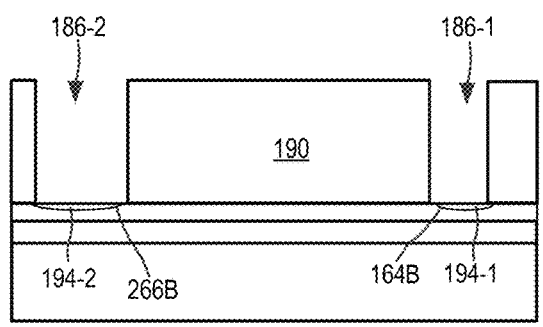
Figure 7E:
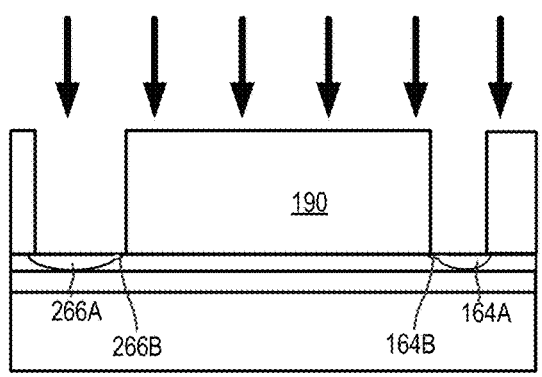
Figure 7F:
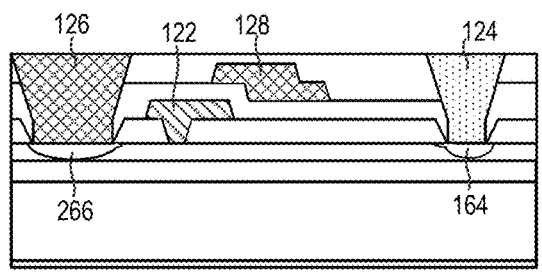

Referring to FIG. 7D, an appropriate chemical may then be deposited on the photoresist mask 190 that causes the photoresist mask 190 to enlarge, thereby shrinking the first and second openings 192-1, 192-2 so as to form narrowed first and second openings 196-1, 196-2. As shown in FIG. 7E, a second ion implantation process may then be performed to implant dopant ions into the exposed portions of the semiconductor layer structure 150. The second ion implantation process acts to complete formation of the respective first and second implanted regions 164A, 266B. As shown in FIG. 7F, the photoresist 190 may then be removed, and the device metallization and interlayer insulating layers may be formed using conventional processing steps.

The techniques disclosed above may be particularly advantageous in implementations where the RF transistor amplifier is implemented as a monolithic microwave integrated circuit (MMIC). A MMIC refers to an integrated circuit that operates on radio and/or microwave frequency signals in which all of the circuitry for a particular function is integrated into a single semiconductor chip. An example MMIC device is an RF transistor amplifier that includes associated matching circuits, feed networks and the like that are all implemented on a common substrate. MMIC RF transistor amplifiers typically include a plurality of unit cell HEMT transistors that are electrically connected in parallel.

Figure 8:
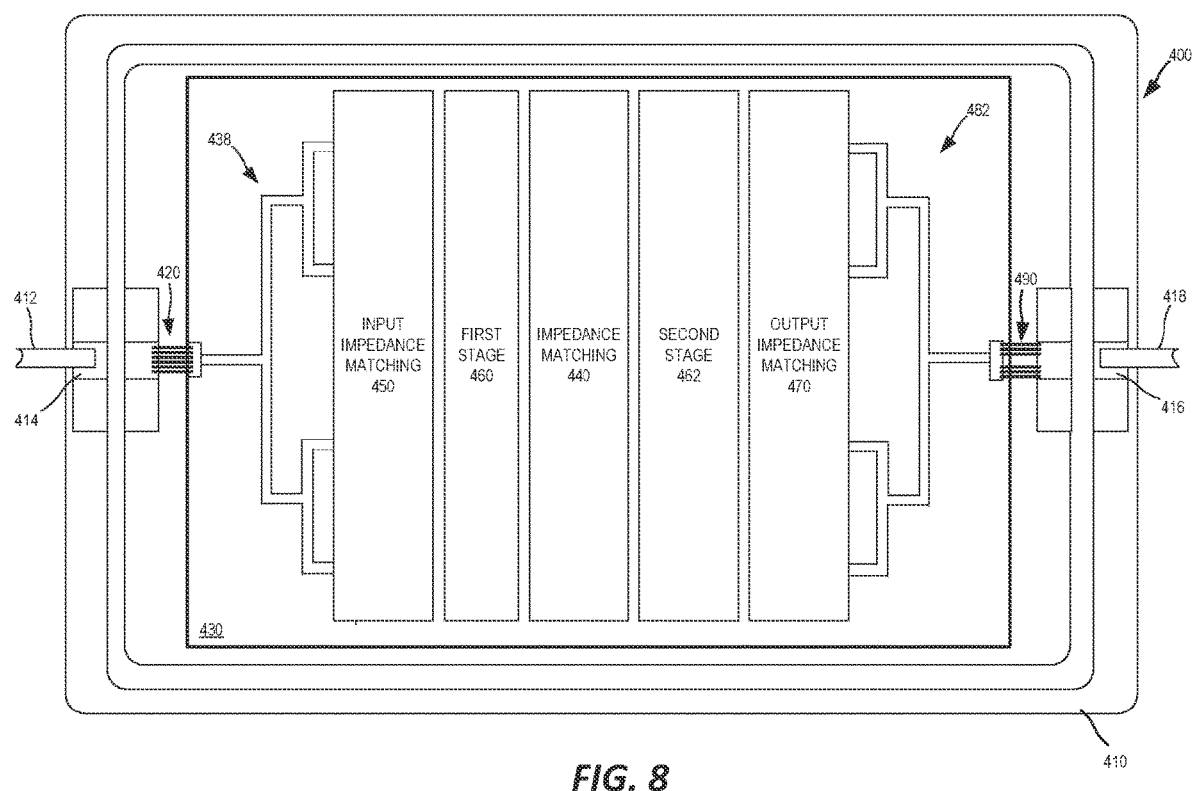
FIG. 8 is a schematic plan view of a monolithic microwave integrated circuit RF transistor amplifier according to embodiments of the present invention.

FIG. 8 is a plan view of a MMIC RF transistor amplifier 400 according to embodiments of the present invention. As shown in FIG. 8, the MMIC RF transistor amplifier 400 includes an integrated circuit chip 430 that is contained within a package 410. The package 410 may comprise a protective housing that surrounds and protects the integrated circuit chip 430. The package 410 may be formed of, for example, a ceramic material. The package 410 includes an input lead 412 and an output lead 418. The input and output leads 412, 418 may be mounted to respective input and output lead pads 414, 416 by, for example, soldering. One or more input bond wires 420 may electrically connect the input lead pad 414 to an input bond pad on the integrated circuit chip 430.

The integrated circuit chip 430 includes an input feed network 438, an input impedance matching network 450, a first RF transistor amplifier stage 460, an intermediate impedance matching network 440, a second RF transistor amplifier stage 462, an output impedance matching stage 470, and an output feed network 482. One or more output bond wires 490 may electrically connect the output lead pad 416 to an output bond pad on the integrated circuit chip 430. The first RF transistor amplifier stage 460 and/or the second RF transistor amplifier stage 462 may be implemented using any of the RF transistor amplifiers according to embodiments of the present invention.

The RF transistor amplifiers according to embodiments of the present invention may be designed to operate in a wide variety of different frequency bands. In some embodiments, these RF transistor amplifier dies may be configured to operate in at least one of the 0.6-2.7 GHZ, 3.4-4.2 GHz, 5.1-5.8 GHz, 12-18 GHz, 18-27 GHZ, 27-40 GHz, 40-75 GHz frequency bands or sub-portions thereof, or in higher frequency bands. The techniques according to embodiments of the present invention may be particularly advantageous for RF transistor amplifiers that operate at frequencies of 10 GHz and higher.

Figure 9A:
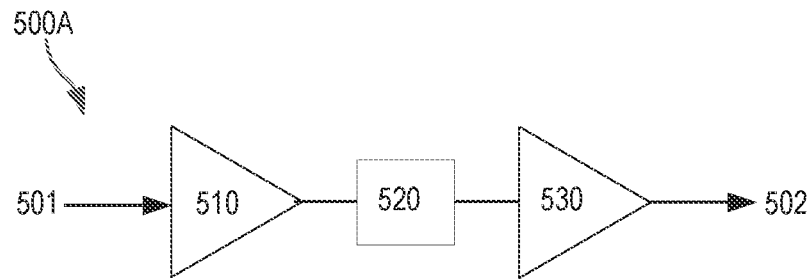
FIGS. 9A-9C are schematic block diagrams of multi-amplifier circuits in which the RF transistor amplifiers according to embodiments of the present invention may be used.
Figure 9B:
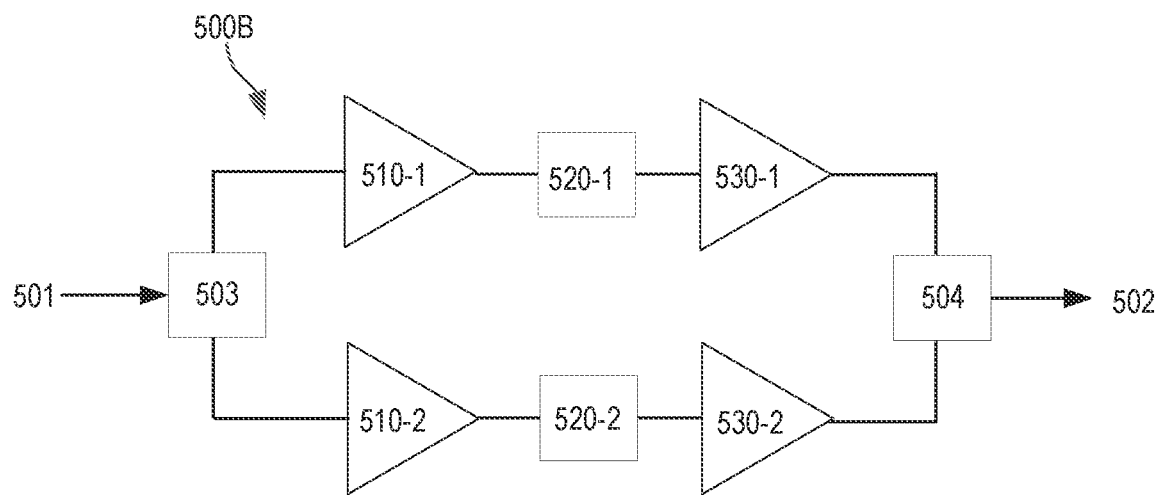
Figure 9C:
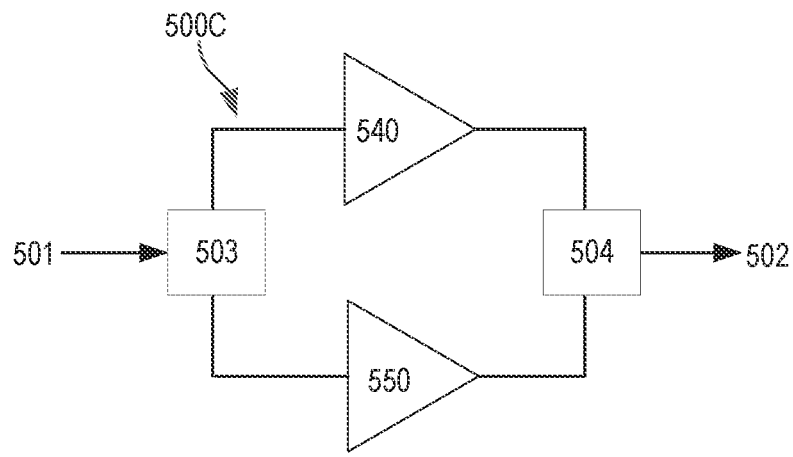

As noted above, the RF transistor amplifiers according to embodiments of the present invention may be particularly useful in MMIC devices that include multiple amplifier stages. FIGS. 9A-9C illustrate several examples of multi-stage MMIC devices in which the techniques according to embodiments of the present invention may be used.

Referring first to FIG. 9A, an RF transistor amplifier 500A is schematically illustrated that includes a pre-amplifier 510 and a main amplifier 530 that are electrically connected in series. As shown in FIG. 9A, RF transistor amplifier 500A includes an RF input 501, the pre-amplifier 510, an inter-stage impedance matching network 520, the main amplifier 530, and an RF output 502. The inter-stage impedance matching network 520 may include, for example, inductors and/or capacitors arranged in any appropriate configuration in order to form a circuit that improves the impedance match between the output of pre-amplifier 510 and the input of main amplifier 530. While not shown in FIG. 9A, RF transistor amplifier 500A may further include an input matching network that is interposed between RF input 501 and pre-amplifier 510, and/or an output matching network that is interposed between the main amplifier 530 and the RF output 502. The RF transistor amplifiers according to embodiments of the present invention may be used to implement either or both of the pre-amplifier 510 and the main amplifier 530.

Referring to FIG. 9B, an RF transistor amplifier 500B is schematically illustrated that includes an RF input 501, a pair of pre-amplifiers 510-1, 510-2, a pair of inter-stage impedance matching networks 520-1, 520-2, a pair of main amplifiers 530-1, 530-2, and an RF output 502. A splitter 503 and a combiner 504 are also provided. Pre-amplifier 510-1 and main amplifier 530-1 (which are electrically connected in series) are arranged electrically in parallel with pre-amplifier 510-2 and main amplifier 530-2 (which are electrically connected in series). As with the RF transistor amplifier 500A of FIG. 9A, RF transistor amplifier 500B may further include an input matching network that is interposed between RF input 501 and pre-amplifiers 510-1, 510-2, and/or an output matching network that is interposed between the main amplifiers 530-1, 530-2 and the RF output 502.

As shown in FIG. 9C, the RF transistor amplifiers according to embodiments of the present invention may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 9C, the Doherty RF transistor amplifier 500C includes an RF input 501, an input splitter 503, a main amplifier 540, a peaking amplifier 550, an output combiner 504 and an RF output 502. The Doherty RF transistor amplifier 500C may optionally include input matching networks and/or an output matching networks (not shown). The main amplifier 540 and/or the peaking amplifier 550 may be implemented using any of the above-described RF transistor amplifiers according to embodiments of the present invention.

Figure 10A:
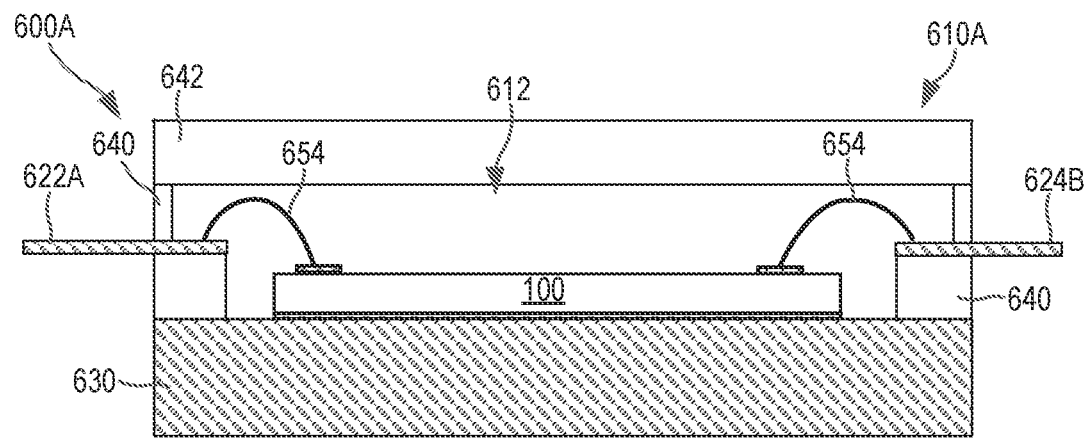
FIGS. 10A and 10B are schematic cross-sectional views illustrating two example ways that that the RF transistor amplifier dies according to embodiments of the present invention may be packaged to provide packaged RF transistor amplifiers.
Figure 10B:
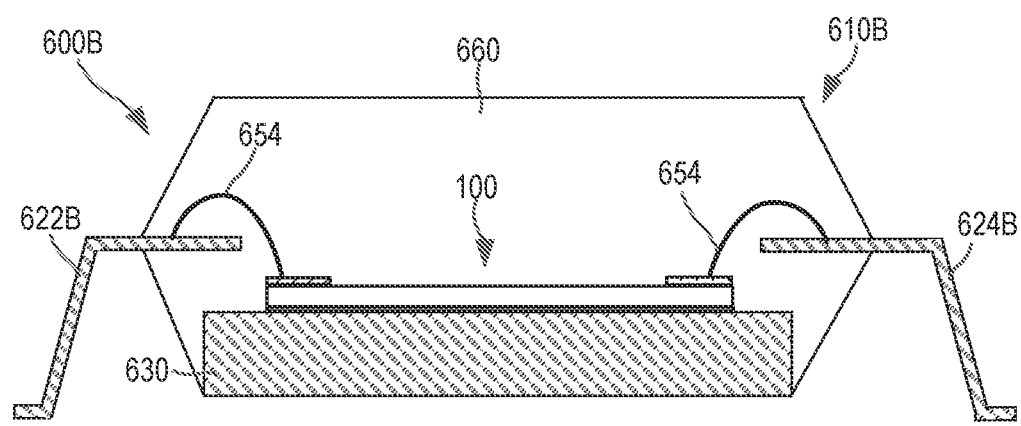

FIGS. 10A and 10B are schematic cross-sectional views illustrating several example ways that that the RF transistor amplifier dies according to embodiments of the present invention may be packaged to provide packaged RF transistor amplifiers 600A and 600B, respectively.

FIG. 10A is a schematic side view of a packaged Group III nitride-based RF transistor amplifier 600A. As shown in FIG. 10A, packaged RF transistor amplifier 600A includes the RF transistor amplifier die 100 packaged in an open cavity package 610A. The package 610A includes metal gate leads 622A, metal drain leads 624A, a metal submount 630, sidewalls 640 and a lid 642.

The submount 630 may include materials configured to assist with the thermal management of the package 600A. For example, the submount 630 may include copper and/or molybdenum. In some embodiments, the submount 630 may be composed of multiple layers and/or contain vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials. In some embodiments, the sidewalls 640 and/or lid 642 may be formed of, for example, $Al_2O_3$. The lid 642 may be glued to the sidewalls 640 using an epoxy glue. The sidewalls 640 may be attached to the submount 630 via, for example, braising. The gate lead 622A and the drain lead 624A may be configured to extend through the sidewalls 640, though embodiments of the present invention are not limited thereto.

The RF transistor amplifier die 100 is mounted on the upper surface of the metal submount 630 in an air-filled cavity 612 defined by the metal submount 630, the ceramic sidewalls 640 and the ceramic lid 642. The gate and drain terminals of RF transistor amplifier die 100 may be on the top side of the semiconductor layer structure 150, while the source terminal is on the bottom side of the semiconductor layer structure 150. The gate lead 622A may be connected to the gate terminal of RF transistor amplifier die 100 by one or more bond wires 654. Similarly, the drain lead 624A may be connected to the drain terminal of RF transistor amplifier die 100 by one or more bond wires 654. The source terminal may be mounted on the metal submount 630 using, for example, a conductive die attach material (not shown). The metal submount 630 may provide the electrical connection to the source terminal 136 and may also serve as a heat dissipation structure that dissipates heat that is generated in the RF transistor amplifier die 100. The heat is primarily generated in the upper portion of the RF transistor amplifier die 100 where relatively high current densities are generated in, for example, the channel regions of the unit cell transistors 102. This heat may be transferred though the source vias 146 and the semiconductor layer structure 150 to the source terminal and then to the metal submount 630.

FIG. 10B is a schematic side view of another packaged Group III nitride-based RF transistor amplifier 600B. RF transistor amplifier 600B differs from RF transistor amplifier 600A in that it includes a different package 610B. The package 610B includes a metal submount 630, as well as metal gate and drain leads 622B, 624B. RF transistor amplifier 600B also includes a plastic overmold 660 that at least partially surrounds the RF transistor amplifier die 100, the leads 622B, 624B, and the metal submount 630. Other components of RF transistor amplifier 600B may be the same as the like-numbered components of RF transistor amplifier 600A and hence further description thereof will be omitted.

While embodiments of the present invention are described above with respect to gallium nitride based RF transistor amplifiers, it will be appreciated that embodiments of the present invention are not limited thereto. For example, the transistors described above may also be used as power transistors in switching and other applications.

Embodiments of the present invention have been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

In the specification and the figures, two-part reference numbers (i.e., two numbers separated by a dash, such as 100-1) may be used to identify like elements. When such two-part reference numbers are employed, the full reference numeral may be used to refer to a specific instance of the element, while the first part of the reference numeral may be used to refer to the elements collectively.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:
1. A method of forming a high electron mobility transistor, the method comprising:
   forming a semiconductor layer structure that comprises a Group III nitride-based channel layer and a Group III nitride-based barrier layer that has a higher bandgap than the Group III nitride-based channel layer on an upper surface of the Group III nitride-based channel layer;
   forming a photoresist on an upper surface of the semiconductor layer structure;

forming a first opening in the photoresist;
implanting ions into the semiconductor layer structure through the first opening to form a first implanted region in the semiconductor layer structure;
enlarging the first opening in the photoresist to create an expanded first opening;
implanting additional ions into the semiconductor layer structure through the expanded first opening using the photoresist as an ion implantation mask to form a first auxiliary implanted region in the semiconductor layer structure and to implant additional ions into the first implanted region,
wherein the first implanted region extends further into the semiconductor layer structure than does the first auxiliary implanted region.

2. The method of claim 1, wherein the first auxiliary implanted region merges into the first implanted region so that the first implanted region and the first auxiliary implanted region together form a first source/drain region in the semiconductor layer structure.

3. The method of claim 2, the method further comprising:
forming a second opening in the photoresist simultaneously with forming the first opening;
implanting ions into the semiconductor layer structure through the second opening to form a second implanted region in the semiconductor layer structure simultaneously with forming the first implanted region, the second implanted region comprising at least a portion of a second source/drain region in the semiconductor layer structure;
forming a gate finger on an upper surface of the semiconductor layer structure, the gate finger defining a first longitudinal axis that extends parallel to the upper surface of the semiconductor layer structure;
forming a first source/drain contact on the first source/drain region; and
forming a second source/drain contact on the second source/drain region,
wherein the first source/drain contact, the second source/drain contact and the gate finger are the contacts of a first unit cell transistor.

4. The method of claim 3, wherein the first source/drain contact has an inner sidewall that faces the second source/drain contact and an outer sidewall opposite the inner sidewall, and the second source/drain contact has an inner sidewall that faces the first source/drain contact and an outer sidewall opposite the inner sidewall, and
wherein a second longitudinal axis that bisects a top surface of the first source/drain region and that is parallel to the first longitudinal axis is closer to the gate finger than is a third longitudinal axis that bisects a bottom surface of the first source/drain contact.

5. The method of claim 4, wherein the first source/drain region has a variable depth, and the third longitudinal axis vertically overlaps a location where the first source/drain region has a maximum depth.

6. The transistor of claim 4, wherein the first source/drain region has a variable doping density, and the third longitudinal axis vertically overlaps a location of a peak doping density of the first source/drain region.

7. The transistor of claim 4, wherein the first auxiliary implanted region is closer to the gate finger than is the first implanted region.

8. The method of claim 3, wherein the first source/drain region extends a first distance from a lower edge of the inner sidewall of the first source/drain contact towards the second source/drain region along a transverse axis that extends parallel to a plane defined by the upper surface of the semiconductor layer structure and perpendicular to the first longitudinal axis, and extends a second distance along the transverse axis from a lower edge of the outer sidewall of the first source/drain contact away from the second source/drain region, where the first distance is between 10% and 50% larger than the second distance.

9. The method of claim 8, wherein the second source/drain region extends a third distance along the transverse axis from a lower edge of the inner sidewall of the second source/drain contact towards the first source/drain region, where the first distance is between 10% and 50% larger than the third distance.

10. The method of claim 8, wherein the first source/drain region has a first width along the transverse axis and the second source/drain region has a second width along the transverse axis, where the first width exceeds the second width.

11. The method of claim 3, further comprising a field plate that extends above an upper surface of the gate finger, the field plate being electrically connected to the second source/drain contact, wherein the field plate does not vertically overlap the first auxiliary implanted region.

12. The method of claim 1, wherein a maximum doping density of the first implanted region exceeds a maximum doping density of the first auxiliary implanted region.

13. The method of claim 1, wherein the first source/drain region is a drain region and the first source/drain contact is a drain contact.

14. The method of claim 1, wherein an average sheet resistance of the first auxiliary implanted region is between 25% and 200% greater than an average sheet resistance of the first implanted region.

15. The method of claim 1, wherein an average sheet resistance of a 2DEG channel region of the transistor is at least twice an average sheet resistance of the first auxiliary implanted region.

16. A method of forming a high electron mobility transistor, the method comprising:
forming a semiconductor layer structure that comprises a Group III nitride-based channel layer and a Group III nitride-based barrier layer that has a higher bandgap than the Group III nitride-based channel layer on an upper surface of the Group III nitride-based channel layer;
forming a first source/drain region in the semiconductor layer structure, the first source/drain region including a first implanted region and a first auxiliary implanted region that merges with the first implanted region;
forming a second source/drain region in the semiconductor layer structure;
forming a gate finger on the semiconductor layer structure, the gate finger having a first longitudinal axis that extends parallel to an upper surface of the semiconductor layer structure;
forming a first source/drain contact on and above the first implanted region, the first source/drain contact having an inner sidewall that faces the gate finger and an outer sidewall opposite the inner sidewall;
forming a second source/drain contact on and above the second source/drain region, the second source/drain contact having an inner sidewall that faces the gate finger and an outer sidewall opposite the inner sidewall;
wherein a depth of the first implanted region is at least twice a depth of the first auxiliary implanted a region,
wherein the first source/drain region extends inwardly a first distance from a lower edge of the inner sidewall of the first source/drain contact towards the second source/drain region along a transverse axis that extends parallel to a plane defined by the upper surface of the semiconductor layer structure and perpendicular to the longitudinal axis, and extends outwardly a second distance along the transverse axis from a lower edge of the outer sidewall of the first source/drain contact away from the second source/drain region, where the first distance exceeds the second distance, and wherein the first source/drain contact, the second source/drain contact and the gate finger are contacts of a first unit cell transistor.

17. The method of claim 16, wherein the first distance is between 10% and 50% larger than the second distance.

18. The method of claim 17, wherein a lower surface of the first source/drain contact is vertically aligned with the first implanted region.

19. The method of claim 18, wherein the second source/drain region includes a second implanted region that is underneath the second source/drain contact and a second auxiliary implanted region that merges with the second implanted region.

20. The method of claim 19, wherein a second longitudinal axis that is parallel to the first longitudinal axis that bisects a top surface of the first source/drain region is closer to the gate finger than is a third longitudinal axis that bisects a bottom surface of the first source/drain contact.

21. The method of claim 20, wherein the third longitudinal axis vertically overlaps at least one of a location where the first source/drain region has a maximum depth and a location of a peak doping density of the first source/drain region.

22. The method of claim 18, wherein the second source/drain region extends a third distance along the transverse axis from a lower edge of the inner sidewall of the second source/drain contact towards the first source/drain contact, where the first distance is between 10% and 50% larger than the third distance.

23. The method of claim 16, wherein a maximum doping density of the first implanted region exceeds a maximum doping density of the first auxiliary implanted region.

24. The method of claim 16, wherein the first source/drain region is a drain region and the first source/drain contact is a drain contact.

25. The method of claim 16, wherein an average sheet resistance of the first auxiliary implanted region is between 25% and 200% greater than an average sheet resistance of the first implanted region.

26. The method of claim 16, wherein an average sheet resistance of a 2DEG channel region of the transistor is at least twice an average sheet resistance of the first auxiliary implanted region.

27. A method of forming a high electron mobility transistor, the method comprising:

forming a semiconductor layer structure that comprises a Group III nitride-based channel layer and a Group III nitride-based barrier layer that has a higher bandgap than the Group III nitride-based channel layer on an upper surface of the Group III nitride-based channel layer;

forming a carbon-containing mask on an upper surface of the semiconductor layer structure;

forming a first opening in the carbon-containing mask;

performing a first ion implantation process to implant ions into the semiconductor layer structure through the first opening;

changing a size the first opening in the carbon-containing mask to create a modified first opening; and performing a second ion implantation process to implant additional ions into the semiconductor layer structure through the modified first opening using the carbon-containing mask as an ion implantation mask, wherein the first and second ion implantation processes together form a first implanted region and a first auxiliary implanted region in the semiconductor layer structure, and wherein the first implanted region and the first auxiliary implanted region together form a first source/drain region in the semiconductor layer structure and the first implanted region extends further into the semiconductor layer structure than does the first auxiliary implanted region.

* * * * *

UNITED STATES PATENT AND TRADEMARK OFFICE
CERTIFICATE OF CORRECTION

PATENT NO. : 12,224,318 B2
APPLICATION NO. : 17/669479
DATED : February 11, 2025
INVENTOR(S) : Bothe et al.

It is certified that error appears in the above-identified patent and that said Letters Patent is hereby corrected as shown below:

In the Specification

Column 1, Line 19: Please correct "(0.5-2.7 GHZ)," to read --(0.5-2.7 GHz),--
Column 1, Line 20: Please correct "S-band (3 GHZ)," to read --S-band (3 GHz),--
Column 1, Lines 21-22: Please correct "V-band (40-75 GHZ)" to read --V-band (40-75 GHz)--
Column 8, Line 2: Please correct "Los," to read --$L_{GS}$,--
Column 8, Line 50: Please correct "6 GHZ)" to read --6 GHz)--
Column 8, Line 52: Please correct "18 GHZ)." to read --18 GHz).--
Column 11, Line 35: Please correct "filed" to read --field--
Column 18, Line 23: Please correct "0≤x<1," to read --0≦x<1,--
Column 20, Line 28: Please correct "FIG. 2A or 4." to read --FIGS. 2A or 4.--
Column 21, Line 35: Please correct "0.6-2.7 GHZ," to read --0.6-2.7 GHz,--
Column 21, Line 36: Please correct "18-27 GHZ," to read --18-27 GHz,--

In the Claims

Column 26, Line 65, Claim 16: Please correct "implanted a region," to read --implanted region,--

Signed and Sealed this
Fifteenth Day of July, 2025

Coke Morgan Stewart
*Acting Director of the United States Patent and Trademark Office*